US011262397B2

(12) United States Patent
Tiwari et al.

(10) Patent No.: US 11,262,397 B2
(45) Date of Patent: Mar. 1, 2022

(54) SYSTEMS AND METHODS FOR SIMULTANEOUSLY TESTING A PLURALITY OF REMOTE CONTROL UNITS

(71) Applicant: Contec, LLC, Schenectady, NY (US)

(72) Inventors: Rajeev Tiwari, San Jose, CA (US); Rafael Alberto Villanueva, Clifton Park, NY (US); Uladzimir Valakh, Troy, NY (US); Francisco Javier Martinez Saldana, Tam (MX)

(73) Assignee: Contec, LLC, Schenectady, NY (US)

( * ) Notice: Subject to any disclaimer, the term of this patent is extended or adjusted under 35 U.S.C. 154(b) by 156 days.

(21) Appl. No.: 16/576,208

(22) Filed: Sep. 19, 2019

(65) Prior Publication Data
US 2021/0088577 A1 Mar. 25, 2021

(51) Int. Cl.
*G01R 31/28* (2006.01)
*G01R 31/3183* (2006.01)
*G01R 31/319* (2006.01)
*H04L 29/12* (2006.01)
*H04L 101/622* (2022.01)

(52) U.S. Cl.
CPC ..... *G01R 31/2808* (2013.01); *G01R 31/2817* (2013.01); *G01R 31/31912* (2013.01); *G01R 31/318314* (2013.01); *H04L 61/6022* (2013.01)

(58) Field of Classification Search
None
See application file for complete search history.

(56) References Cited

U.S. PATENT DOCUMENTS

| 4,152,929 | A | 5/1979 | Edmond et al. |
| 4,444,049 | A | 4/1984 | Hitchcock |
| 5,276,692 | A * | 1/1994 | Kwon ............... G08C 25/00 340/12.22 |
| 9,091,706 | B2 * | 7/2015 | Partee ............... G01R 1/02 |
| 9,813,534 | B2 | 11/2017 | Koltsov et al. |
| 11,206,503 | B2 | 12/2021 | Tiwari et al. |
| 11,212,516 | B2 | 12/2021 | Tiwari et al. |
| 2001/0056544 | A1 | 12/2001 | Walker |
| 2005/0101314 | A1 | 5/2005 | Levi |
| 2005/0152557 | A1 | 7/2005 | Sasaki et al. |
| 2007/0069756 | A1 * | 3/2007 | Ambler ............... G01R 31/002 324/750.27 |
| 2009/0111422 | A1 | 4/2009 | Bremer et al. |
| 2010/0281178 | A1 | 11/2010 | Sullivan |

(Continued)

OTHER PUBLICATIONS

Tiwari, Rajeev; Final Office Action for U.S. Appl. No. 16/576,147, filed Sep. 19, 2019, dated Dec. 9, 2020, 16 pgs.

(Continued)

*Primary Examiner* — Jermele M Hollington
(74) *Attorney, Agent, or Firm* — Taylor English Duma LLP

(57) ABSTRACT

Technologies are described herein for enabling the automated testing of remote control units by providing a suitable test system that includes a plurality of test stations for simultaneously testing a plurality of remote control units. Each test station includes features that allow it to interact with the remote control unit's inputs, such as buttons and microphone, and outputs, such as IR and RF remote control codes, status LEDs, and audio output. Each test station may be controlled by a controller that executes test scripts or other routines that exercise the functionality of the remote control unit as desired.

13 Claims, 15 Drawing Sheets

(56) References Cited

U.S. PATENT DOCUMENTS

| | | | |
|---|---|---|---|
| 2010/0302025 A1 | 12/2010 | Script | |
| 2013/0040599 A1 | 2/2013 | Berg et al. | |
| 2013/0212228 A1 | 8/2013 | Butler et al. | |
| 2014/0187172 A1* | 7/2014 | Partee | H04L 43/045 455/67.12 |
| 2014/0197857 A1 | 7/2014 | Partee | |
| 2015/0229919 A1 | 8/2015 | Weber et al. | |
| 2016/0301786 A1 | 10/2016 | Koltsov et al. | |
| 2017/0238401 A1 | 8/2017 | Sadwick | |
| 2018/0036886 A1 | 2/2018 | Jenkinson et al. | |
| 2018/0063569 A1 | 3/2018 | Yu | |
| 2019/0295544 A1 | 9/2019 | Garcia et al. | |
| 2020/0005634 A1 | 1/2020 | Shuff | |
| 2020/0100162 A1 | 3/2020 | Sallas et al. | |
| 2021/0092352 A1* | 3/2021 | Tiwari | H04N 21/42204 |
| 2021/0092541 A1* | 3/2021 | Tiwari | G08C 17/02 |

OTHER PUBLICATIONS

Tiwari, Rajeef; Final Office Action for U.S. Appl. No. 16/576,177, filed Sep. 19, 2019, dated Dec. 18, 2020, 32 pgs.

Tiwari, Rajeev; Non-Final Office Action for U.S. Appl. No. 16/576,147, filed Sep. 19, 2019, dated Jul. 30, 2020, 15 pgs.

Tiwari, Rajeev; Non-Final Office Action for U.S. Appl. No. 16/576,177, filed Sep. 19, 2019, dated Aug. 18, 2020, 31 pgs.

Tiwari, Rajeev; Non-Final Office Action for U.S. Appl. No. 16/576,147, filed Sep. 19, 2019, dated Apr. 14, 2020, 12 pgs.

Tiwari, Rajeev; Non-Final Office Action for U.S. Appl. No. 16/576,177, filed Sep. 19, 2019, dated Apr. 23, 2020, 24 pgs.

Tiwari, Rajeev; Notice of Allowance for U.S. Appl. No. 16/576,147, filed Sep. 19, 2019, dated Aug. 30, 2021, 21 pgs.

Tiwari, Rajeev; Supplemental Notice of Allowance for U.S. Appl. No. 16/576,147, filed Sep. 19, 2019, dated Oct. 25, 2021, 6 pgs.

Tiwari, Rajeev; Supplemental Notice of Allowance for U.S. Appl. No. 16/576,147, filed Sep. 19, 2019, dated Sep. 20, 2021, 4 pgs.

Tiwari, Rajeev; Notice of Allowance for U.S. Appl. No. 16/576,177, filed Sep. 19, 2019, dated Sep. 13, 2021, 18 pgs.

Tiwari, Rajeev; Supplemental Notice of Allowance for U.S. Appl. No. 16/576,177, filed Sep. 19, 2019, dated Oct. 25, 2021, 6 pgs.

* cited by examiner

SYSTEMS AND METHODS FOR SIMULTANEOUSLY TESTING A PLURALITY OF REMOTE CONTROL UNITS

CROSS-REFERENCE TO RELATED APPLICATIONS

This application is related to U.S. patent application Ser. No. 16/576,147 entitled "Automated Test System for Testing Remote Control Units," filed on Sep. 19, 2019, and to U.S. patent application Ser. No. 16/576,177 entitled "Automated Universal Test System for Testing Remote Control Units," filed on Sep. 19, 2019, both of which are filed concurrently herewith and are hereby incorporated by reference in their entireties.

TECHNICAL FIELD

This disclosure relates to systems for testing consumer electronics products. More specifically, this disclosure relates to a test system that can be configured to perform comprehensive testing of a plurality of multi-function remote control units simultaneously.

BRIEF SUMMARY

The present disclosure relates to technologies for testing the functionality of remote control units of the type commonly used in conjunction with a variety of consumer electronics products, such as set-top boxes that are supplied to subscribers by pay television service providers. According to some embodiments, a test station for testing remote control units can comprise a plurality of features that allow the test station to be used in conjunction with an automated system for testing a variety of functions associated with the remote control units.

According to further embodiments, a test station comprises a test fixture with features that allow a remote control unit to be precisely positioned and held in place in the test station during a testing process. The test fixture further comprises a plurality of actuators, such as solenoids, that are aligned with buttons on the remote control unit and capable of pressing each of the buttons in response to instructions from a controller or computer that is part of the test station. The station further comprises receivers for receiving infrared (IR) and radio frequency (RF) remote control codes that are transmitted by the remote control unit to a target device (e.g., a set-top box, television, video game console, or other consumer electronics device) in response to the pressing of each button.

According to further embodiments, a test station can further comprise sensors capable of detecting the color of light emitted by one or more status indicators on the remote control unit and, separately, the presence of light emitted by the buttons when they are illuminated or backlit during use.

According to further embodiments, a test station can further comprise a microphone for detecting tones emitted by a speaker on the remote control unit, and a speaker for providing audio input to a microphone on the remote control unit. The test station can comprise hardware or software configured to analyze the audio captured by the microphone on the remote control unit.

According to further embodiments, multiple test stations can be connected to and controlled by server or personal computer in order to provide a test system configured to simultaneously test multiple remote control units and provide an efficient and convenient user interface for a test system operator.

Various implementations described in the present disclosure can comprise additional systems, methods, features, and advantages, which may not necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims. The features and advantages of such implementations can be realized and obtained by means of the systems, methods, features particularly pointed out in the appended claims. These and other features will become more fully apparent from the following description and appended claims, or can be learned by the practice of such exemplary implementations as set forth hereinafter.

BRIEF DESCRIPTION OF THE DRAWINGS

In the following Detailed Description, references are made to the accompanying drawings, which form a part hereof, and show, by way of illustration, specific embodiments or examples. The features and components of the following figures are illustrated to emphasize the general principles of the present disclosure. The drawings herein are not drawn to scale. Like numerals represent like elements throughout the several figures.

DETAILED DESCRIPTION

Figure 1A:
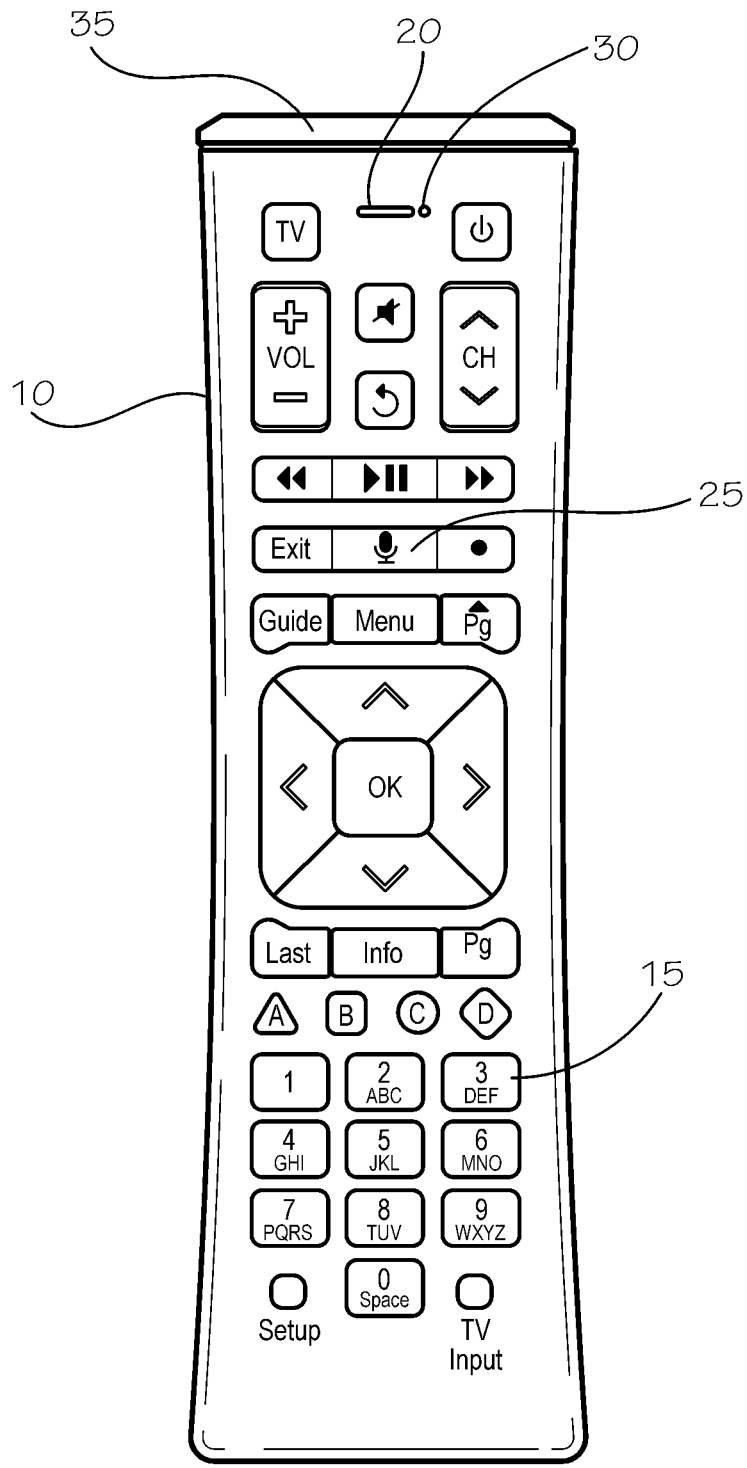
FIG. 1a is a front view of an exemplary remote control unit for consumer electronics products, such as a set-top box associated with a pay television service, according to embodiments that are described herein.

The present disclosure can be understood more readily by reference to the following detailed description, examples, drawings, and claims, and their previous and following descriptions. However, before the present devices, systems, and/or methods are disclosed and described, it is to be understood that this disclosure is not limited to the specific devices, systems, and/or methods disclosed unless otherwise specified, as such can, of course, vary. It is also to be understood that the terminology used herein is for the purpose of describing particular aspects only and is not intended to be limiting.

The following description is provided as an enabling teaching of the present devices, systems, and/or methods in their best, currently known aspect. To this end, those skilled in the relevant art will recognize and appreciate that many changes can be made to the various aspects described herein, while still obtaining the beneficial results of the present disclosure. It will also be apparent that some of the desired benefits of the present disclosure can be obtained by utilizing some of the features of the present disclosure without utilizing other features. Accordingly, those who work in the art will recognize that many modifications and adaptations to the present disclosure are possible and can even be desirable in certain circumstances and are a part of the present disclosure. Thus, the following description is provided as illustrative of the principles of the present disclosure and not in limitation thereof.

As used throughout, the singular forms "a," "an" and "the" include plural referents unless the context clearly dictates otherwise. Thus, for example, reference to a quantity of one of a particular element can comprise two or more such elements unless the context indicates otherwise.

Ranges can be expressed herein as from "about" one particular value, and/or to "about" another particular value. When such a range is expressed, another aspect comprises from the one particular value and/or to the other particular value. Similarly, when values are expressed as approximations, by use of the antecedent "about" or "substantially," it will be understood that the particular value forms another aspect. It will be further understood that the endpoints of each of the ranges are significant both in relation to the other endpoint, and independently of the other endpoint.

For purposes of the present disclosure, a material property or dimension measuring about X or substantially X on a particular measurement scale measures within a range between X plus an industry-standard upper tolerance for the specified measurement and X minus an industry-standard lower tolerance for the specified measurement. Because tolerances can vary between different materials, processes and between different models, the tolerance for a particular measurement of a particular component can fall within a range of tolerances.

As used herein, the terms "optional" or "optionally" mean that the subsequently described event or circumstance may or may not occur, and that the description comprises instances where said event or circumstance occurs and instances where it does not.

The word "or" as used herein means any one member of a particular list and also comprises any combination of members of that list.

To simplify the description of various elements disclosed herein, the conventions of "top," "bottom," "side," "upper," "lower," "horizontal," and/or "vertical" may be referenced. Unless stated otherwise, "top" describes that side of the system or component that is facing upward and "bottom" is that side of the system or component that is opposite or distal the top of the system or component and is facing downward. Unless stated otherwise, "side" describes that an end or direction of the system or component facing in horizontal direction. "Horizontal" or "horizontal orientation" describes that which is in a plane aligned with the horizon. "Vertical" or "vertical orientation" describes that which is in a plane that is angled at 90 degrees to the horizontal.

The following detailed description is directed to technologies for automatically testing remote control units of the type commonly used to control consumer electronics products, such as set-top boxes provided to subscribers by pay television service providers (e.g., cable TV service providers, satellite TV service providers, etc.). A pay television service provider typically provides a set-top box and its associated remote control unit to a subscriber with the expectation that these devices will be returned to the service provider at some point in the future. In most cases, the set-top boxes are leased to subscribers and remain the property of the pay television service provider.

Subscriber equipment, such as remote control units, set-top boxes, or other equipment, may be returned to the service provider for several reasons. In some cases, the equipment fails to work properly and is returned to the service provider when the customer is provided with a replacement. In other cases, a subscriber may want to upgrade the equipment to a newer model or to a model that offers different features. Finally, subscriber equipment is returned to the service provider when a subscriber cancels his or her service and no longer needs the equipment.

Unless the returned equipment is outdated or obsolete, the service provider usually will want to reuse the equipment and provide it to other subscribers. In some cases, this may require that the equipment be repaired, refurbished, and tested to ensure that it works properly and is in good condition. If the equipment is satisfactory, it will be repackaged and put back into the service provider's inventory so that it may be sent to new subscribers, or to existing subscribers who need a replacement or upgrade. This reuse of equipment allows the service providers to reduce the amount of new equipment they purchase from their suppliers, thus saving a significant amount of money.

Simple remote control units have limited functionality. In many cases, they work with a single piece of equipment (e.g., a television it was supplied with) and transmit specific IR remote control codes in response to buttons being pressed. For example, they send a code that corresponds to "channel up" in response to the "channel up" button being pressed. Modern remote control units are more sophisticated and offer additional functionality. They are often described as "universal" remote control units, because they are capable of controlling several devices (e.g., cable set-top box, television, Blu-ray player, etc.) In addition to outputting IR remote control codes, they also output radio frequency (RF) remote control codes in response to buttons being pressed. This RF feature allows the remote control units to be used with equipment that is placed in cabinets or behind walls, which interferes with an unobstructed line of sight between the remote control unit and the receiver. The RF feature may also make possible additional features, such as allowing the remote control unit to respond to the subscriber's voice commands (e.g., "watch ESPN"). A suitable technology for implementing RF technology in remote control units is described in the Zigbee RF4CE (Radio Frequency for Consumer Electronics) specification published by the Zigbee Alliance, which operates in the 2.4 GHz band (see IEEE 802.15.4). In addition, Cable Television Laboratories, Inc. (CableLabs) has published a specification for an MSO profile for RF4CE that is specifically designed to facilitate remote control of a target device by a remote control unit in a cable set-top environment (see OC-SP-RF4CE-101-120924; Cable Profile for ZigBee RF4CE Remote Control Specification).

Some remote control units incorporate status indicators, such as status LEDs, to provide a visual indication (e.g., by changing color) of the status of the remote control unit (i.e., whether it has been restored to factory default mode, whether it has been paired with a target device, etc.). The buttons also may be backlit to make it easier to use the remote control unit in a dark room. Some of the more sophisticated remote control units also provide a voice control feature and include a microphone that allows them to receive voice commands spoken by a subscriber. The voice commands may be straightforward (e.g., "watch ESPN") or may involve more complex tasks, like searching for a show by title, by the name of a cast member, etc. A speaker on the remote control unit outputs a tone that indicates whether the voice command was understood by the remote control unit and the associated subscriber equipment.

Before a used remote control unit may be redeployed to a subscriber by the service provider, it can be tested to ensure that it works properly and inspected to ensure that it does not have cosmetic damage that would render it unsuitable for future use. The process of testing a remote control unit may include pressing each button and analyzing the resulting IR or RF remote control codes to determine if they are correct. The other functionality can also be tested, including status lights, button backlighting, the microphone, and the speaker.

Some of the functionality can be tested by a person without the use of sophisticated test equipment. For example, a person can simply press the buttons on the remote control unit and see if the backlighting is activated. Similarly, a person can enter specific button sequences to reset the remote control unit and see if the status LED changes colors in response. Some aspects of the operation of the microphone and speaker may also be verified by a person without additional equipment.

Without some equipment, it is not possible to confirm that the proper IR or RF remote control codes are transmitted in response to the buttons being pushed. Simple, but incomplete, testing can be done using a television receiver or a set-top box. This would allow a person to confirm that the remote control unit is able to turn the device on and off, or change channels, or adjust the volume in response to the corresponding buttons being pressed. However, sophisticated remote control units include a database or library of remote control codes that allow them to be used with multiple brands and models of set-top boxes, televisions, and other consumer electronics products. It is not possible to test all of these remote control codes without having multiple televisions, set-top boxes, etc. available. Furthermore, it would take a significant amount of time for a person to thoroughly test a remote control unit using this method.

Instead of settling for incomplete testing or assembling the collection of equipment needed to test most of the remote control unit's IR functionality, it is possible to use an IR remote control unit decoder/tester that is capable of receiving and decoding IR remote control codes and displaying the codes it receives on its display for visual confirmation by a user. Several models are available from various sources, including the Generic Universal TV IR Remote Control Decoder Tester available from amazon.com. Although these devices are capable of recognizing a large number of remote control codes, they still require considerable human effort and time to confirm that the code that is displayed on the tester is the code that is supposed to correspond with the pressed button.

In order to overcome these obstacles and provide a system that is capable of quickly, efficiently, and thoroughly testing the functionality of remote control units, embodiments described in the present disclosure feature a test station that employs various features to perform the appropriate testing. The test station includes a test fixture that holds the remote control unit securely in place so that the buttons on the remote control unit are aligned with actuators (e.g., solenoids) that are configured to press the buttons on the remote control unit in response to signals from a controller. The test station can include IR and RF receivers that receive the codes that are transmitted by the remote control unit when each button is pressed. The test station can also comprise light sensors, a speaker, and a microphone in order to test other functionality of the remote control unit. These features allow a sophisticated remote control unit to be tested automatically, quickly, and thoroughly, and its condition to be accurately ascertained in order to determine if it is functioning properly and suitable for reuse.

Figure 1B:
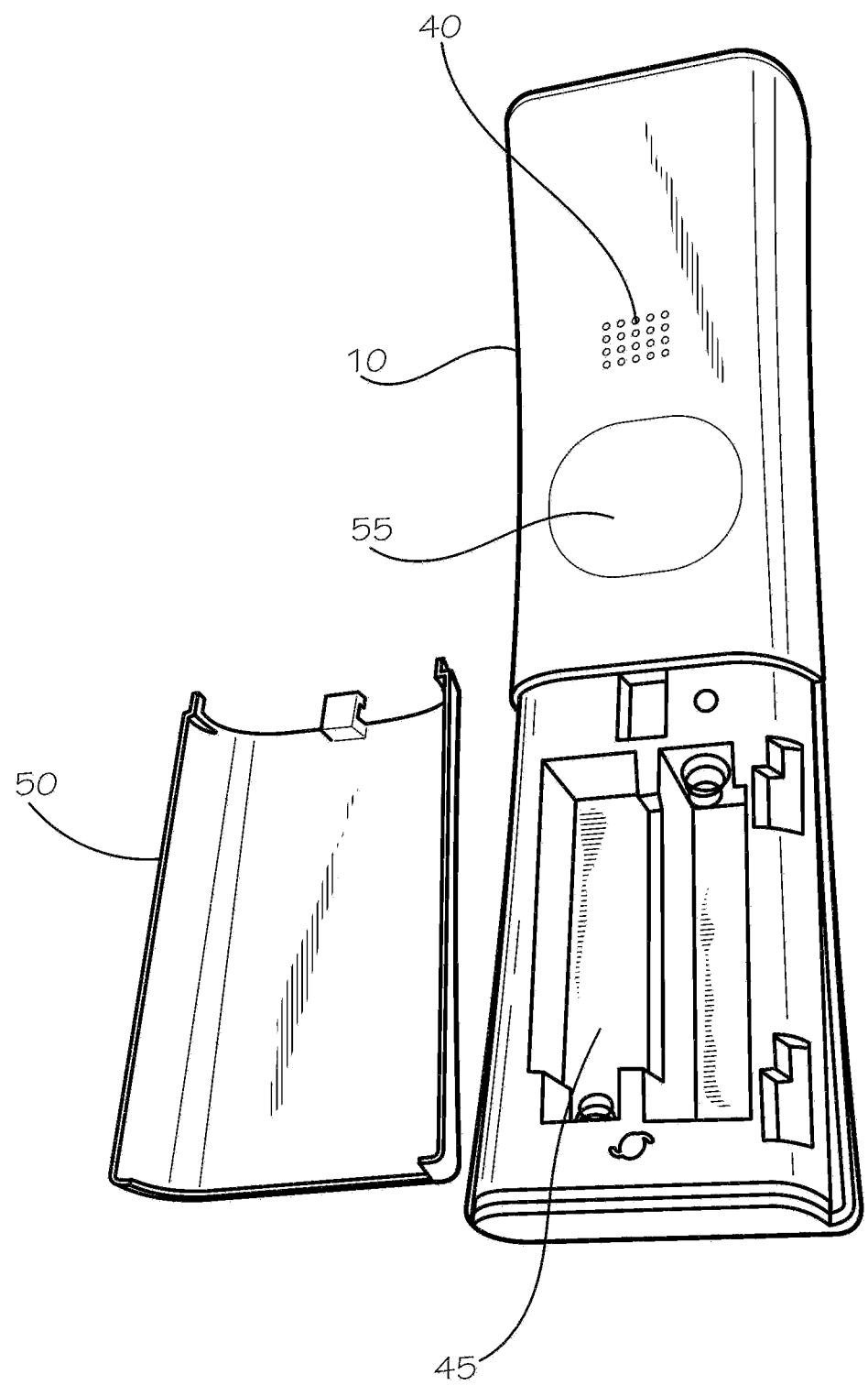
FIG. 1b is a rear view of the exemplary remote control unit of FIG. 1a, and shows a battery compartment and other features that are found on a rear of the remote control unit.

FIGS. 1a and 1b illustrate a remote control unit 10 of the type commonly used with consumer electronics products, such as a set-top box provided by a pay television service provider. FIG. 1a is a front view of remote control unit 10 and depicts several features of the device. The remote control unit 10 includes a plurality of keys or buttons 15 that are associated with the functions that may be executed using the remote control unit 10. The remote control unit 10 depicted in FIG. 1 includes 41 buttons (note that Vol+/− and Ch/\/\/ are each counted as two since each button toggles about its center line). Some of the buttons are used to turn power to a TV or to the set-top box on or off. Other buttons are available to control volume up/down and channel up/down. Those skilled in the art will appreciate that other buttons may be used to control streaming video, navigate menus, select options, enter channel numbers, etc. Although most remote control units offer similar functionality, the number of buttons on a remote control unit, and the functions associated with those buttons, vary among the different makes and models of remote control units. In addition, those skilled in the art will appreciate that some remote control units (such as the Philex SLx RC050 remote control) can employ touch screens or other types of displays in place of some or all of the conventional buttons or keys shown on the remote control unit 10 in FIG. 1, and that the features and advantages of the present disclosure may be modified and adapted to work with touch screen displays and the buttons displayed on them.

Other features of remote control unit 10 are shown in FIG. 1. A status LED 20 indicates the status of the remote control unit. A microphone button 25 may be used to enable the remote control unit 10 to accept voice commands via a microphone 30. A top of the remote control unit 10 has an IR lens 35, which protects an IR LED transmitter located beneath it while allowing the IR signals emitted by the IR LED located under the IR lens to pass through the lens with minimal attenuation or interference. The buttons 15 may be backlit in order to facilitate use of the remote control unit 10 in a dark environment.

FIG. 1b is a rear view of the remote control unit 10 and illustrates additional features of the remote control unit 10.

Remote control unit 10 includes a speaker 40. It also includes a battery compartment 45, which holds two AA batteries and normally is covered by battery cover 50. The remote control unit may also include a recessed area 55, which may make it easier for a user to orient and hold the remote control unit in his or her hand. Those skilled in the art will appreciate that speaker 40 may be a conventional speaker or any other audio output device capable of producing a suitable tone or sound (e.g., a piezoelectric transducer).

Figure 2:
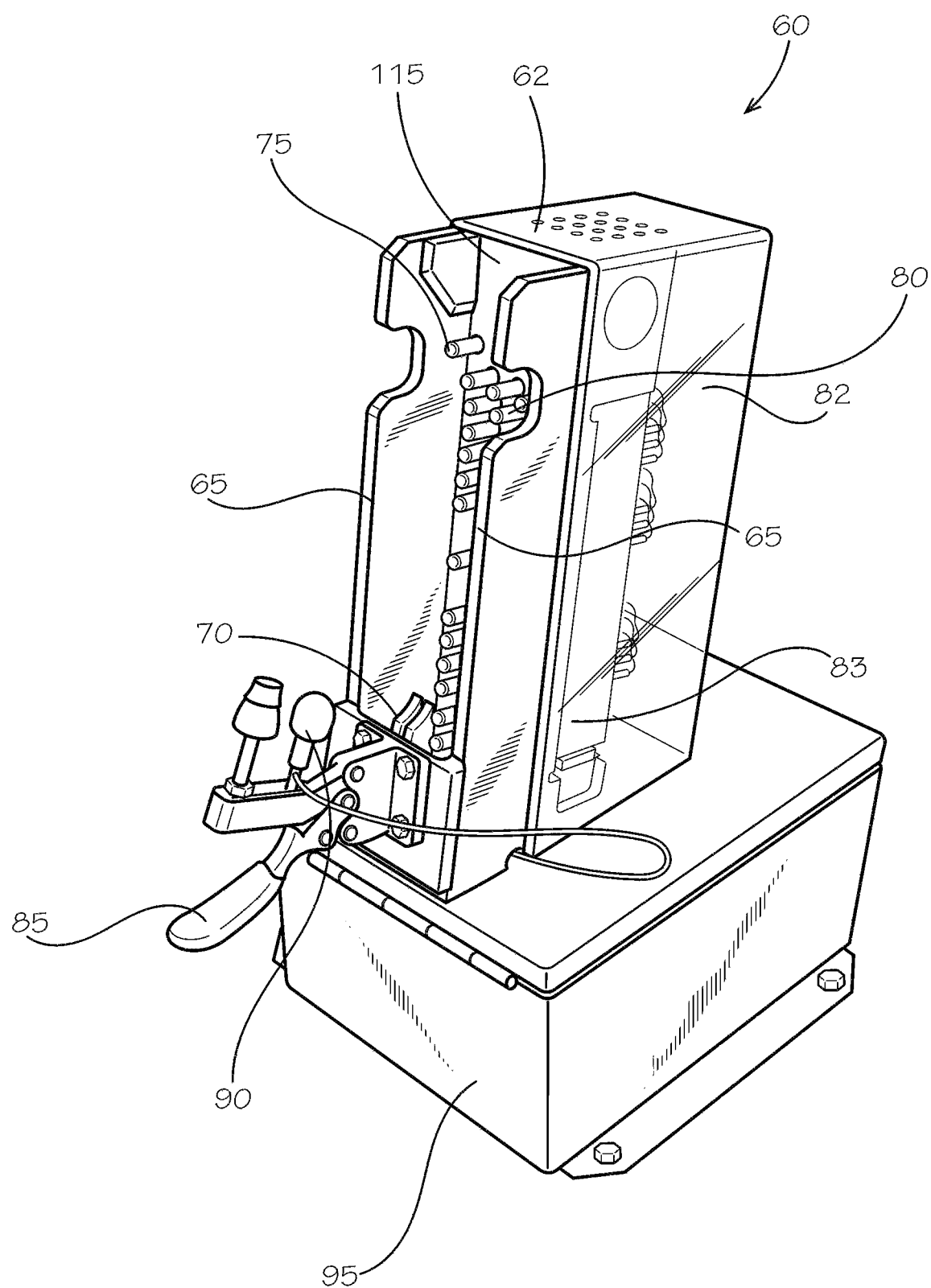
FIG. 2 is a perspective view of a test station for testing the remote control unit of FIG. 1, according to embodiments that are described herein.
Figure 4:
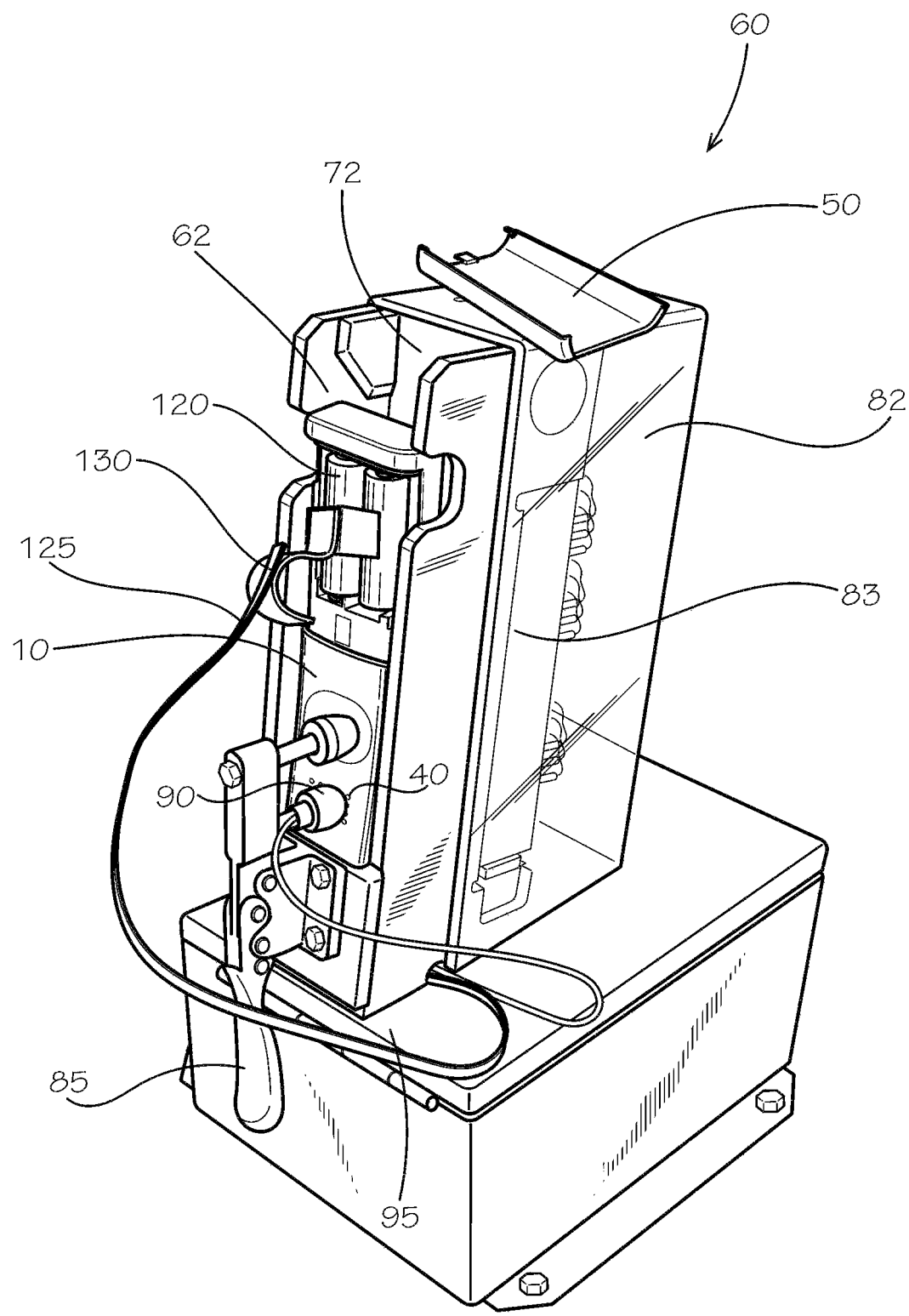
FIG. 4 is a perspective view of the test station of FIG. 2 with the remote control unit of FIG. 1 inserted in the test fixture, the toggle clamp closed, and a line-powered battery pack simulator inserted in the battery compartment of the remote control unit.
Figure 5:
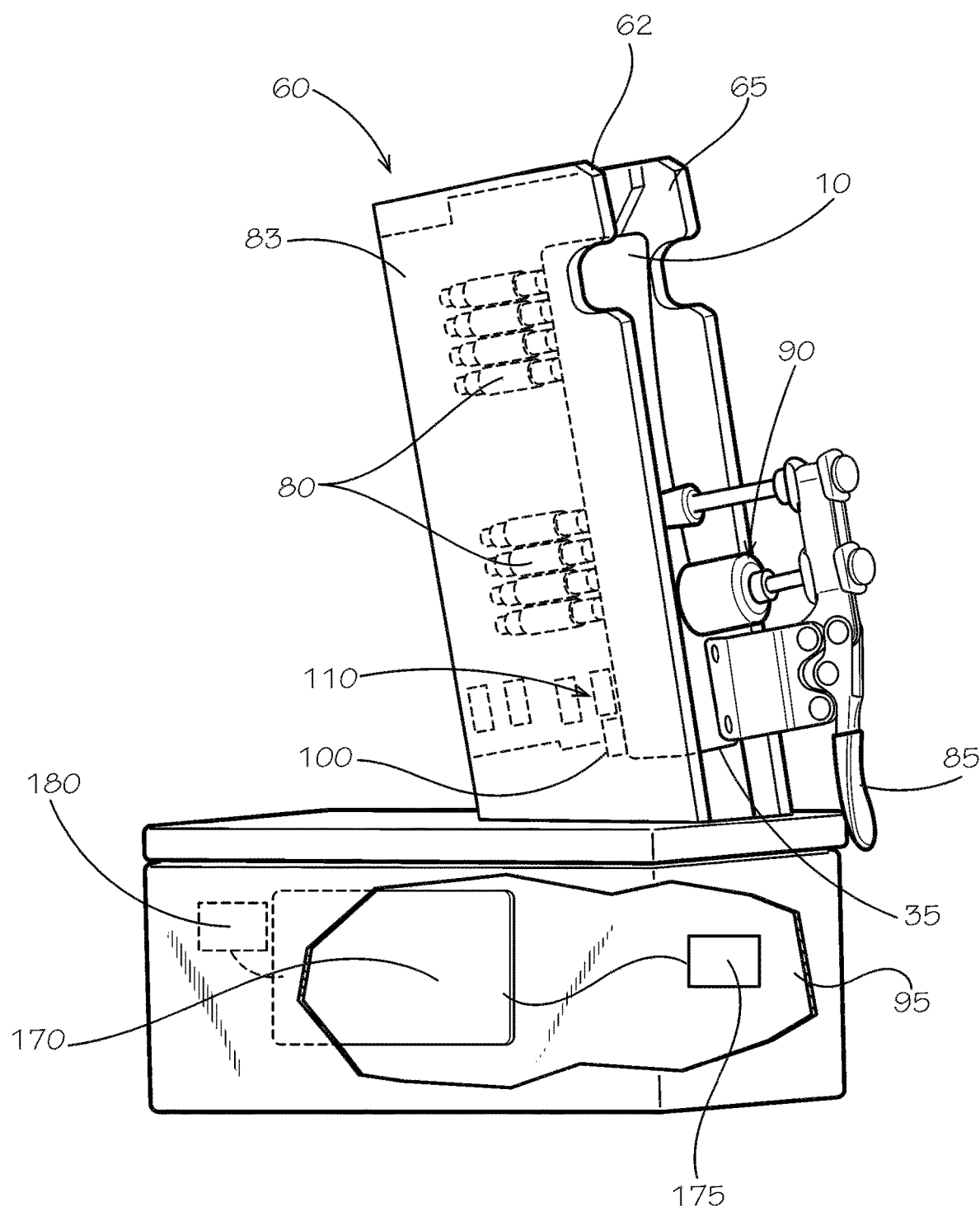
FIG. 5 is a cutaway view of the test station of FIG. 2 showing the relationship between the remote control unit and the features of the test station.

FIG. 2 is a perspective view of a test station 60 for testing remote control unit 10 of FIG. 1. The test station is designed to receive remote control unit 10 (as illustrated in FIGS. 4 and 5) and hold it securely in place during the testing process. The test station 60 includes a test fixture 62 and a control box 95. The test fixture 62 includes side walls 65, which form a chamber or cavity for the remote control unit 10. The width of the chamber coincides with the specific remote control units to be tested. A bottom of the chamber can include at least one support 70, such as a set screw, which forms a bottom surface on which the remote control unit rests while in the test fixture 62. As shown more clearly in FIGS. 4 and 5, the remote control unit 10 is inserted upside down (i.e., with the IR lens 35 pointing downward and resting on support 70) with the buttons 15 facing an interior face 72 (shown in FIG. 3) of the actuator plate 115. The front surface of the remote control unit 10 can rest against set screws 75, which provide fixed points of reference for the remote control unit 10 and maintain the proper spacing between the actuators 80 and the buttons 15.

Figure 3:
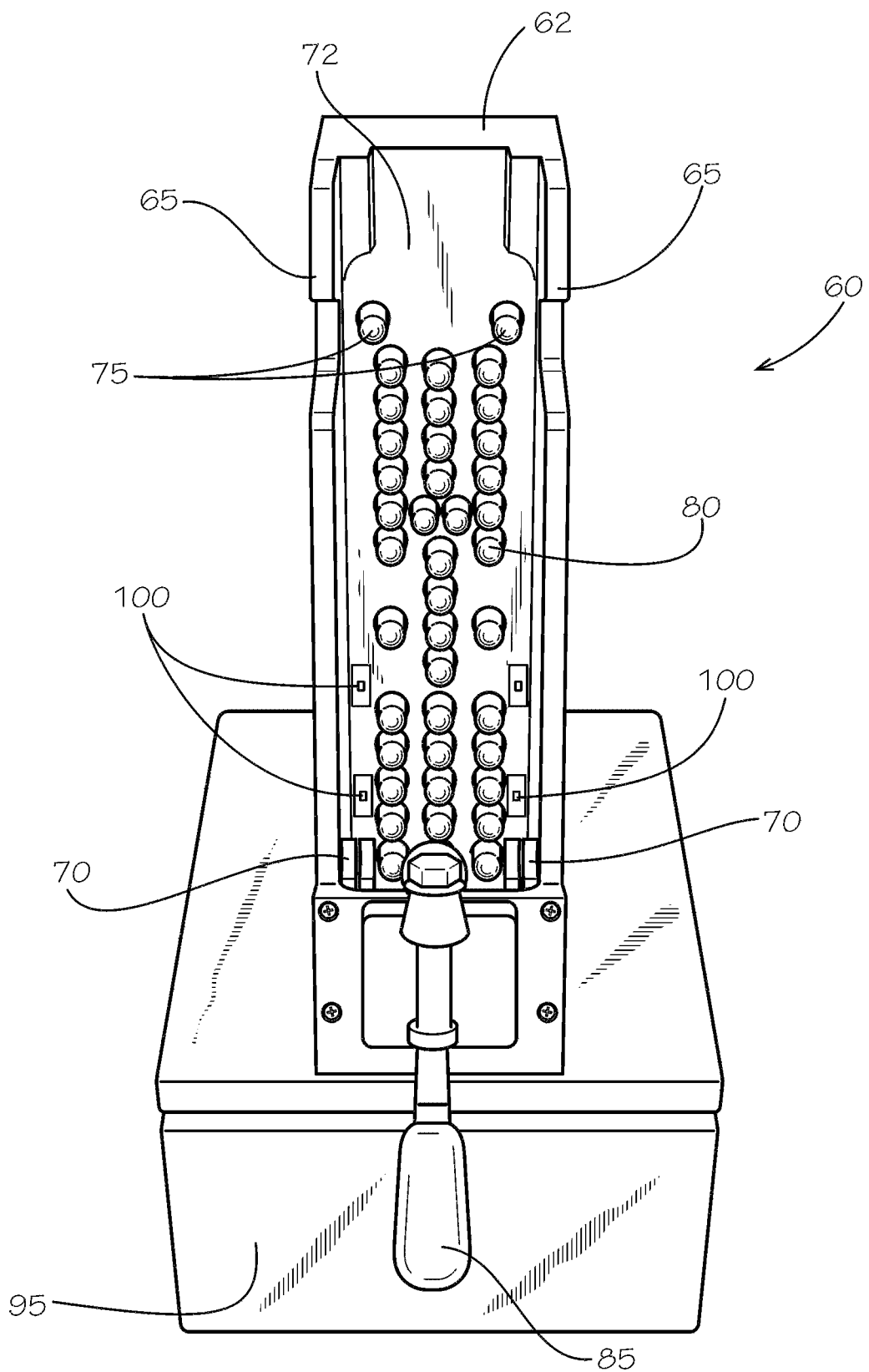
FIG. 3 is a front view of the test station of FIG. 2.

FIG. 3 shows the interior face 72 of the test fixture and more clearly shows a plurality of actuators 80, which are capable of pressing the buttons on the remote control unit in response to a signal from a controller 170 (FIG. 5). Those skilled in the art will appreciate that an actuator is, generally speaking, a component of a machine that is responsible for moving a mechanism. There are different types of actuators, including electrical, hydraulic, pneumatic, and mechanical. An actuator's motion may be linear or rotational. In the present disclosure, the actuators can be electrical, tubular, linear solenoids, which may be easily controlled by appropriate electrical signals from a controller.

The test fixture can include an actuator positioned as needed to press each of the remote control unit's buttons that will be tested. If, for some reason, a button on the remote control unit does not need to be tested, the test fixture does not need to provide an actuator for that button. A toggle clamp 85 may be used to clamp the remote control unit in place so that it is properly aligned with the actuators 80 and held firmly enough that the actuators are able to reliably press the buttons 15 without pushing the entire remote control unit backward away from the actuators. The design of the test fixture 62, including the side walls 65, supports 70, set screws 75, and toggle clamp 85 are such that the remote control unit can be held firmly in position where the buttons are aligned with the actuators 80.

The design parameters for the test fixture can depend on the size, shape and features of the remote control unit to be tested. Buttons on the remote control unit come in a variety of sizes and shapes. Some may be very small. Some may be positioned very close together. Consequently, the arrangement between the test fixture and the remote control unit under test may be quite precise. Those skilled in the art will appreciate that sufficient precision can be obtained by a variety of methods, including close tolerances on the width of the chamber formed by the test fixture's side walls 65 relative to the width of the remote control unit under test, the positioning of the supports 70 in the bottom of the test fixture, the positioning of the set screws 75, and the positioning of the toggle clamp 85 that is used to secure the remote control unit 10 in the test fixture 62.

As shown in FIG. 2, the test fixture 62 can also comprise a cover 82 that can be configured to protect the portions of the actuators that protrude out the back of the actuator plate 115. At least one printed circuit board (test fixture circuit board 83) may be mounted on the test fixture and form part of a circuit that controls the actuators 80 and other components of the test fixture 62. The cover 82 can be made of clear plastic to allow the operator to observe the operation of the actuators. However, those skilled in the art will appreciate that this is not necessary and that the cover 82 may be made of other suitable materials. Alternatively, the cover 82 may be omitted entirely.

In addition to the aforementioned elements, FIG. 2 shows a test fixture microphone 90, which can be attached to the toggle clamp 85 and capable of picking up sounds emitted by the speaker 40 on the back of the remote control unit 10. The test fixture also includes a fixture speaker 110 (FIG. 5) that provides audio input for the remote control unit's microphone 30. The test station 60 can also include receivers 175, 180 (FIG. 5) configured to receive the IR and RF remote control codes transmitted by remote control unit 10 in response to buttons being pressed by the actuators 80. In order to test the remote control unit's status LED and button backlighting, the test fixture 62 can include at least one light detector or light sensor 100 (FIG. 3) positioned on the interior face 72 of the test fixture 62. The test fixture can be mounted on control box 95, which houses a controller 170 (FIG. 5) that is configured to generate signals to control the actuators 80 and fixture speaker 110 and to receive signals from the light sensors 100 and the fixture microphone 90 and from the IR and RF receivers 175, 180. The IR receiver 175 may be located adjacent the supports 70 or further down in the control box 95, provided that there is an adequate line of sight between the remote control unit's IR lens 35 and the IR receiver 175. The RF receiver 180 can be located almost anywhere in the test station 60 since it does not rely on an unobstructed line of sight between it and the remote control unit.

FIG. 3 also illustrates additional light sensors 100 that can be mounted on the interior face 72 of the actuator plate 115 of the test fixture 62 for the purpose of determining whether the button backlighting is working. The supports 70 can include discrete supports positioned near the side walls 65 and made of metal, plastic, or other suitable materials. Alternatively, supports 70 can be replaced with a shelf made of clear plastic, Plexiglas, or some other material that allows the IR signals to pass through it. The test fixture also includes a fixture speaker 110 that is positioned adjacent the remote control unit's microphone 30 (when the remote control unit is properly positioned in the test fixture).

In an exemplary embodiment, the light sensors can each be a VEML6040 RGBW Color Sensor with I2C Interface, manufactured by Vishay Intertechnology, Inc., or any other light sensor that is small enough and sensitive enough to operate in this environment. Those skilled in the art will appreciate that it is possible to detect the presence of the backlighting without having a light sensor for each backlit button. In this embodiment, one light sensor 100 can be positioned adjacent the remote control unit's status LED, and other light sensors 100 can be positioned around the interior face 72 of the actuator plate 115 in a manner sufficient to determine if the backlight function is working. The number and placement of the light sensors may vary depending on the light-related features on the remote control unit and the need to test those features.

In an embodiment, the actuators 80 can be tubular push solenoids mounted in holes in the actuator plate 115. The positioning of the solenoids can be such that when the remote control unit is placed in the test fixture, the surface of the actuators 80 may be in contact with, but not depress, the buttons 15 on the remote control unit 10 when the solenoids are in their un-actuated or un-energized state. It is possible that some of the buttons on the remote control unit may be different heights than other buttons 15 on the remote control unit. Thus, the placement and position of the solenoids in a test fixture will depend on the features of the specific remote control units to be tested in that text fixture. The stroke (i.e., the distance the solenoid's piston travels when energized), force, and timing of the solenoids' actuation will be determined by the specifications or requirements for the particular buttons on the specific remote control units that will be tested. For example, actuating a solenoid for a brief period of time (for example, 200 milliseconds) may be sufficient to test most buttons and their associated commands. However, a solenoid may need to be actuated for several seconds to confirm that buttons associated with commands like channel up/down or volume up/down repeat when those buttons are pressed and held. Customized or custom-made solenoids may be obtained from various suppliers if the features of the remote control units under test require some combination of size, force, and stroke that is not readily available in the off-the-shelf products.

FIGS. 4 and 5 illustrate how a remote control unit 10 is positioned and secured in the test station 60 and how power is supplied to the remote control unit 10 during testing. In FIG. 4, the remote control unit 10 has been inserted into the test fixture 62 so that the IR lens 35 (shown in FIG. 1*a*) is facing downward and the buttons 15 (shown in FIG. 1*a*) are facing toward the interior face 72 of the actuator plate 115 so that the buttons 15 are adjacent the actuators 80. The battery cover 50 has been removed so that the battery compartment 45 is open. In this view, the toggle clamp 85 locked into place. The action of the toggle clamp 85 can press the remote control unit firmly up against the set screws 75 (shown in FIG. 2) and can ensure that the position of the buttons relative to the solenoids (actuators 80) is appropriate. It also ensures that the remote control unit remains in the proper position when the actuators press the buttons. When the toggle clamp 85 is locked into place, the fixture microphone 90 can be simultaneously moved into position adjacent the speaker 40 on the back of remote control unit 10.

FIG. 4 also shows a line-powered battery pack simulator 120. Remote control units typically require one or more AA or AAA batteries in order to operate. Line-powered battery pack simulators or battery pack replacements are known in the art and can be used to provide a line-powered alternative to disposable batteries. These battery pack simulators provide a power source with the same form and fit as AA or AAA batteries that fit into normal battery compartments, but they are powered by a cable or cord 125 that runs to a power source. The power supply may plug into an AC wall outlet, or power to the cable may be supplied by circuitry in the control box 95, in which case the control circuitry can control power (i.e., turn power on or off) to the remote control unit under test. The battery pack simulator 120 of the present disclosure is configured to replace two AA batteries and supplies approximately 3 volts DC to the remote control unit. The battery pack simulator 120 also employs a handle 130 to facilitate the operator's insertion of the battery pack simulator 120 at the beginning of the testing and removal of the battery pack simulator 120 when testing is completed.

FIG. 5 is a partial cutaway view of the test station of FIG. 2 that shows additional aspects of the relative positions of the remote control unit 10 and the features of the test station 60. As described early, but shown more clearly here, the remote control unit 10 is positioned in the test fixture 62 with the IR lens 35 facing downward and the buttons facing the actuators 80. As more clearly shown in this figure, the test fixture speaker 110 is located adjacent the remote control unit's microphone 30 and one of the light sensors 100 is located adjacent the remote control unit's status LED 20.

In FIG. 5, the exterior of the control box 95 is cut away to show components that can be located in the interior of the control box 95. In this embodiment, a controller 170, such as a Raspberry Pi computer, can be mounted inside the control box 95, and connected to an IR receiver 175 and an RF receiver 180. The IR receiver 175 can be located below the IR lens 35 of the remote control unit 10. It may be positioned close to the IR lens 35 or further down in the control box 95, as long as the path between the IR lens and the IR receiver is not obstructed. A representative IR receiver 175 can be the TSOP38238 IR Receiver Module for Remote Control Systems, manufactured by Vishay Intertechnology or other, similar device. The RF receiver 180 can be a RF4CE-compatible dongle, such as the CC2531EMK USB dongle evaluation module kit, which provides a USB interface to 802.15.4/Zigbee applications and is manufactured by Texas Instruments Incorporated. The position of the RF receiver 180 is not critical since the remote control unit's RF transmissions are not directional and do not require an unobstructed line of sight. In the test station of FIG. 5, the RF receiver 180 plugs into a USB port associated with the controller 170. Those skilled in the art will appreciate that while the Zigbee RF4CE standard is the RF standard that is most commonly used in remote control units, other wireless or RF standards are available. For example, Wi-Fi Direct and Bluetooth may be used. The receiver or receivers that are used in the test station can be selected based on the functionality of the remote control unit that is being tested.

Those skilled in the art will appreciate that in other embodiments, test fixtures can be similar in some aspects to the test fixture 62 discussed above, and that in other embodiments, the actuators, speakers, microphones, light sensors, and other features of the test fixture may be positioned in different places on the test fixture in order to accommodate the features of the specific type of remote control unit to be tested. This can include having actuators, speakers, microphones, etc. that engage with corresponding features of the remote control unit (e.g., buttons, microphone, speaker, etc.) that may be on a side or other surface of the remote control unit.

In order to use the test station to perform automated testing on the remote control unit 10, the test station can have a controller 170 and associated circuitry capable of executing a test routine and controlling, manipulating, or communicating with the various features of the test station 60, and with a user or operator. The controller 170 can be programmed to execute a process or method that utilizes the features of the test fixture 62 to test some or all of the functions of the remote control unit 10.

Figure 6:
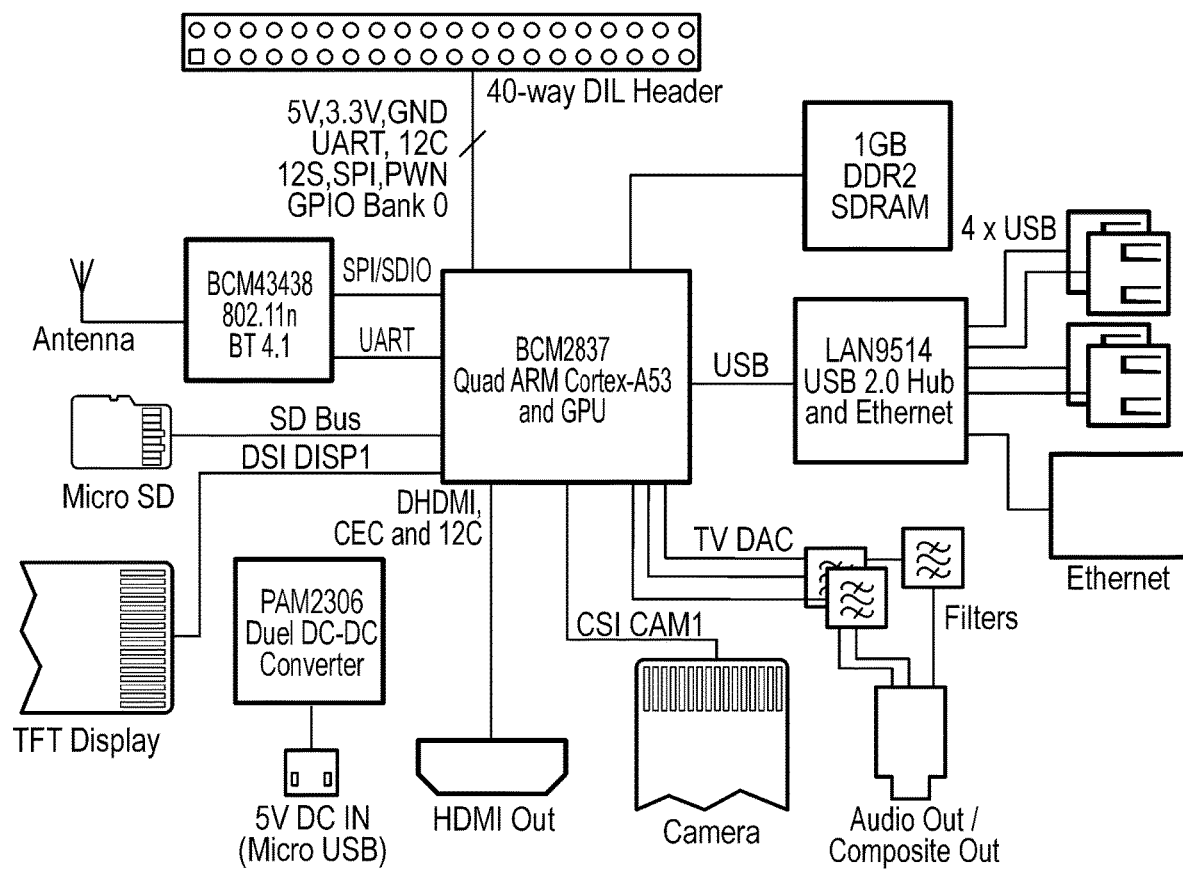
FIG. 6 is a block diagram of a computer suitable for use in the test station of FIG. 2.

In one embodiment, the controller 170 can be a commercially available computer such as a Raspberry Pi, a microcontroller such as Arduino, or similar device. FIG. 6 is a block diagram of a Raspberry Pi 3 Model B. The Raspberry Pi 3 Model B includes a variety of features that make it suited for use in this context. It includes a Broadcom 64-bit CPU and 1 GB of RAM and runs a Linux-based operating system. It includes a variety of input/output ports, including four USB 2 ports, one Ethernet port, and one HDMI port. It includes 802.11n and Bluetooth capability. It runs off of +5 VDC and has a 40-pin connector for providing a variety of configurable input and output pins or signals to other circuit boards or devices. Many of the pins and signals on the 40-pin GPIO (General Purpose Input/Output) connector may be configured as analog or digital, and as inputs or outputs, based on the needs of the user. Other pins conform to common standards and protocols, such as the Inter-Integrated Circuit (I2C) serial protocol developed by Philips Semiconductor.

Those skilled in the art will appreciate that the Raspberry Pi computer's features facilitate connection to, and interaction with, a variety of input/output and display devices. For example, in an exemplary embodiment, a USB device, such as the RF4CE-compatible USB dongle (RF receiver 180) mentioned above, can be plugged directly into a USB port on the Raspberry Pi computer. Other devices may be connected via general purpose input/output pins provided on the controller 170, while others may require additional interface circuitry to decode signals from the controller or to interface with signals coming from other elements of the test fixture.

Figure 7:
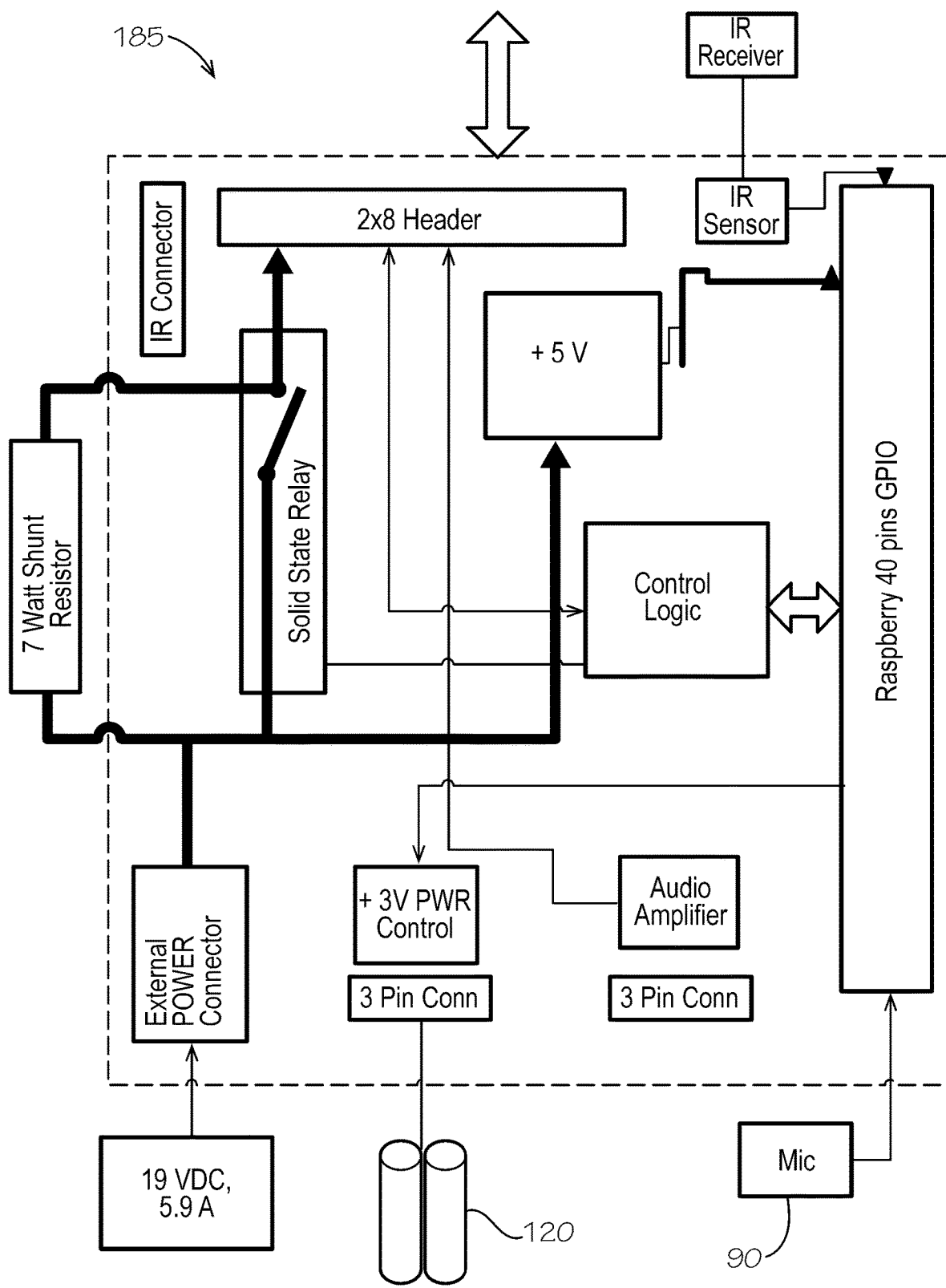
FIG. 7 is a block diagram of a controller board for interfacing the computer of FIG. 6 to a test fixture.

FIG. 7 is a block diagram of a controller interface board 185 for interfacing the controller 170 to features of the test fixture 62 for the purpose of testing the functionality of a remote control unit 10. Generally speaking, the controller board connects to the controller 170 (Raspberry Pi) via the 40-pin GPIO connector. The controller interface board 185 includes connectors, control logic, power control and other circuitry need to interface the controller 170 to the test fixture 62.

Figure 8:
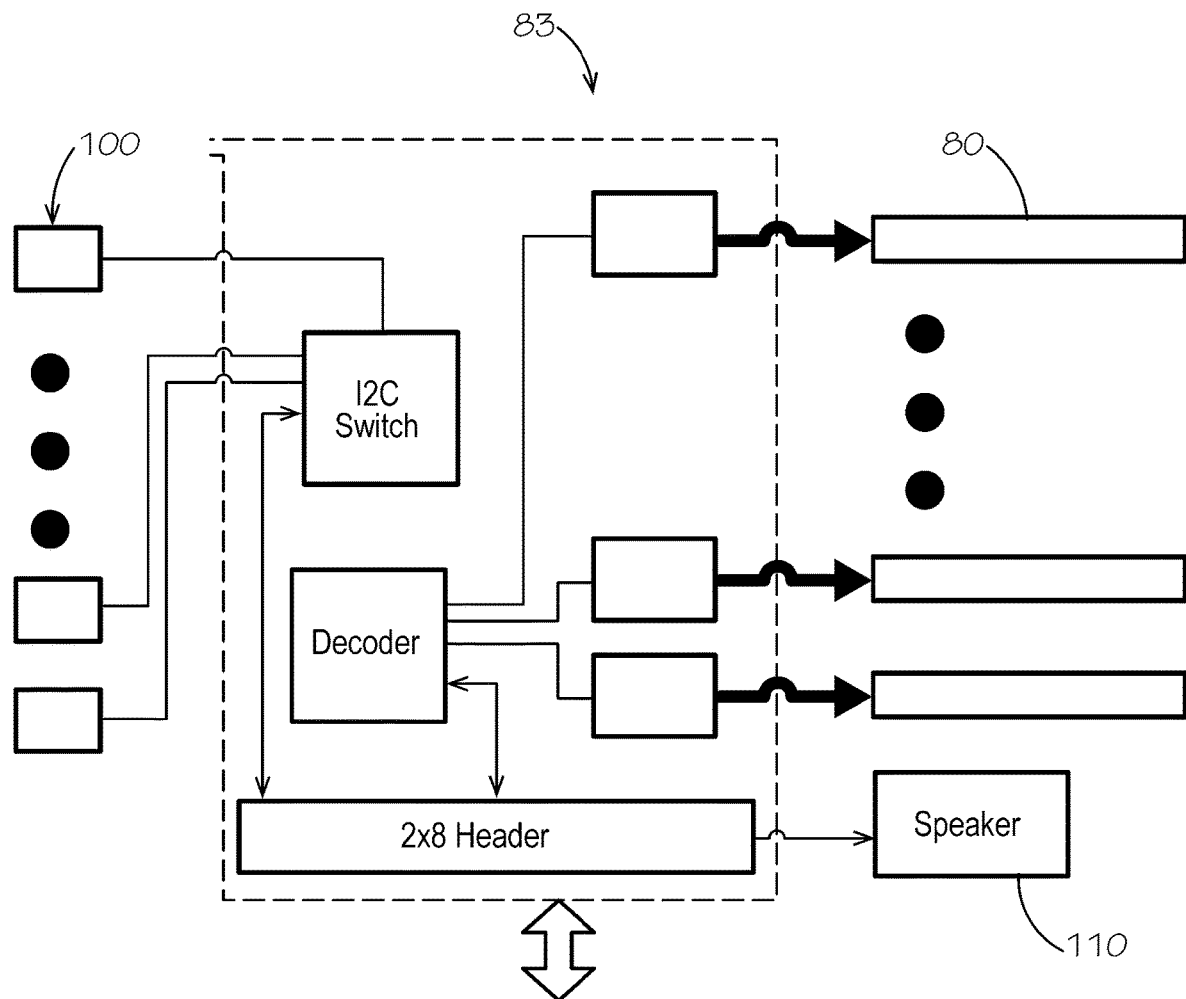
FIG. 8 is a block diagram of a test fixture circuit board that is associated with a test fixture.

FIG. 8 is a block diagram of a test fixture circuit board 83, which is a part of the test fixture 62 and provides the electrical interface to specific features of test fixture 62. For example, the test fixture circuit board 83 can include Inter-Integrated Circuit (I2C) switches that interface with the light sensors 100 on the test fixture 62 and decoders sufficient to decode signals from the controller 170 that are used to actuate the solenoids (actuators 80). The test fixture circuit board can also provide an audio signal to the fixture speaker 110. The controller interface board 185 can connect to the test fixture circuit board 83 by means of a 16-pin (i.e., 2×8) connector.

The features and operation of the controller 170, controller interface board 185, and test fixture circuit board 83 will be described together.

One function of the test station is to provide power to the test fixture and to the remote control unit being tested. In an exemplary embodiment, the controller interface board 185 receives +19.6 VDC (5.9 A) from an external power supply via an external power connector. This input voltage is provided to a voltage regulator that provides +5 VDC to the 40-pin connector in order to power the Raspberry Pi computer. The +19.6 VDC input voltage is also provided to the test fixture circuit board via the 16-pin (2×8) header after passing through a solid state relay and a shunt resistor.

Those skilled in the art will appreciate that when actuating a solenoid, a voltage is applied to the winding to create a magnetic field. Because the winding can have a large inductance, the current takes some time to build up. The force of the core is proportional to the current. In order to generate maximum force to move the core, a relatively high voltage must be applied to the winding to quickly build the current. Once the movement of the core is complete, a much smaller current usually can be used to hold the core in position. If the current is not reduced, considerable power is dissipated in the winding and the solenoid may generate a large amount of heat.

Figure 9:
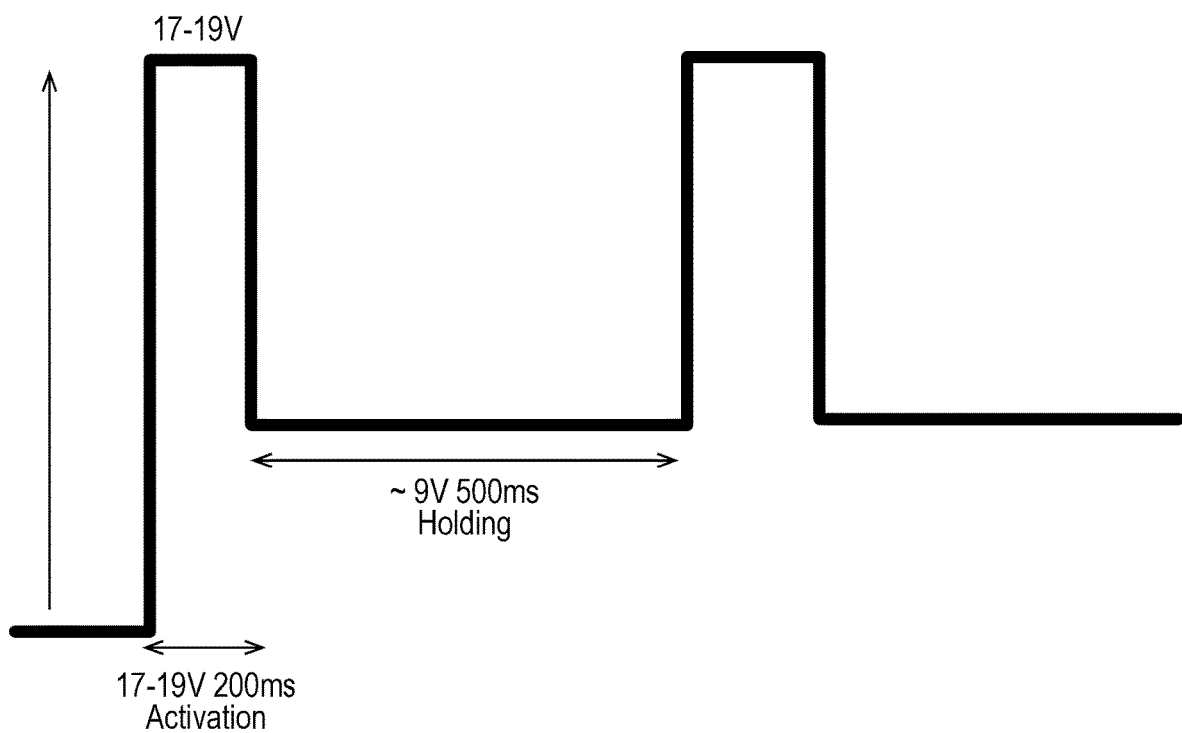
FIG. 9 is a timing diagram illustrating a signal for controlling solenoids that form a part of the test fixture of FIG. 2.

FIG. 9 illustrates a timing diagram showing the voltage that may be applied to the solenoids via the solid state relay and shunt resistor. When a solenoid is actuated, a voltage in the range of +17 to 19 VDC is applied to the solenoid winding for approximately 200 milliseconds. Then the voltage is reduced to approximately +9 VDC for approximately 500 milliseconds. The specific voltages and timing will depend on the types of solenoids used and the timing requirements of the buttons on the remote control unit and the functions being tested. For example, the channel up button may be pressed for several seconds to ensure that is sends repeated channel up commands.

Referring again to FIG. 7, the input from the fixture microphone 90 (FIG. 5) is provided to the controller 170 via the 40-pin GPIO connector. The input from the IR receiver 175 is provided to the controller 170 via the 40-pin GPIO connector. An audio signal from the controller 170 is passed through an audio amplifier and provided to the fixture speaker 110 via the 16-pin connector. Power (+3 VDC) is provided to the battery pack simulator 120 via a connector on the controller interface board 185. The +3 VDC power to the battery pack simulator 120 may be turned on and off by the controller 170.

The primary interactions between the controller interface board 185 (FIG. 7) and the test fixture circuit board 83 (FIG. 8) pertain to the actuators 80 and the light sensors 100 that form a part of the test fixture. In an exemplary embodiment, the light sensor communicates with the controller via the I2C interface. An I2C switch (such as the PCA9548A from Texas Instruments, or a similar device) located on the test fixture circuit board 83 allows the controller 170 to address each of the light sensors one at a time and read from it data that represent the color and intensity of the light. With respect to the solenoids (actuators 80), a decoder allows the controller to address the specific solenoid that will be actuated. Those skilled in the art will appreciate that a 5-bit decoder is suitable for addressing up to 32 different devices, while a 6-bit decoder will allow 64 devices to be addressed. The output of the decoder may control a relay, which will provide a drive signal to the solenoid. The timing of the drive signal and its different voltage levels can be controlled by timing generation circuitry that can include logic, a monostable pulse generator (such as an LTC6993 from Linear Technology), a solid state relay and a serially-connected power resistor to reduce voltage during the holding stage.

Those skilled in the art will appreciate that the specifics of the controller interface board 185 and the test fixture circuit board 83 can vary depending on the remote control unit to be tested and the text fixture used to test it. Furthermore, the test station 60 is designed so that the same control box 95 can be used with test fixtures designed for a variety of different types of remote control units. This may be accomplished by mounting a different test fixture to the control box, connecting the controller interface board 185 to the test fixture circuit board 83, and ensuring that the controller is executing the test process or routine associated with the connected test fixture and remote control unit.

Figure 10:
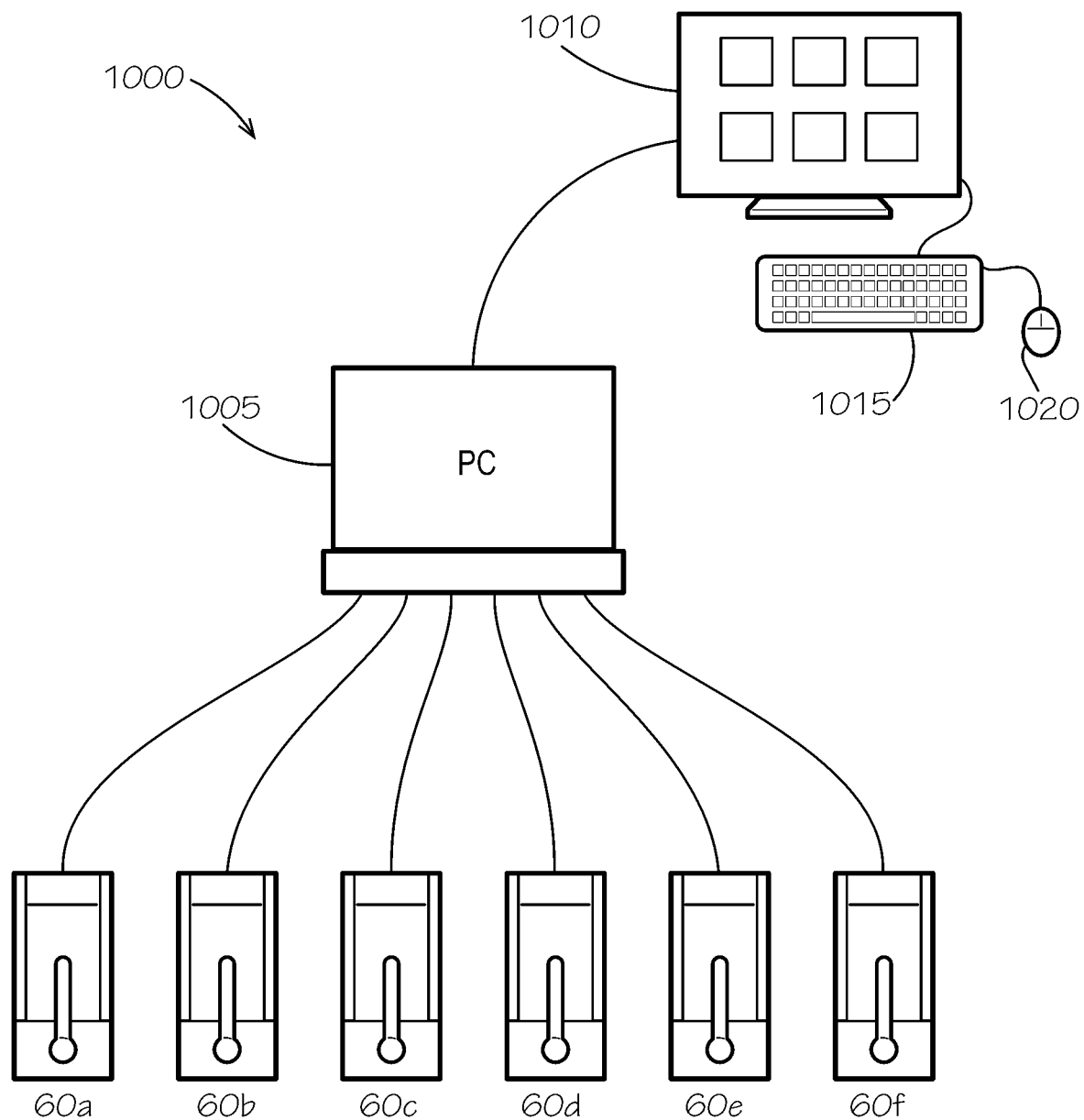
FIG. 10 is a diagram of a test system that comprises a plurality of test stations connected to a master controller that controls the testing.

FIG. 10 is a diagram of a test system for simultaneously testing a plurality of remote control units. The test system can include a plurality of test stations 60a-f that are connected to a master controller 1005 or central computer. The master controller 1005 can be connected to a user interface device, such as display 1010 and a keyboard 1015 and mouse 1020 or other input device. Alternatively, the user interface device (display 1010) may include a touch screen, which can eliminate the need for the keyboard 1015 and mouse 1020. The description that follows describes the use of a touch screen user interface device, though the same input can be provided using a keyboard and mouse or other pointing device. Each of the test stations 60*a-f* may be connected to the master controller 1005 by any of a variety of types of connections, include USB cable, Ethernet cable, Wi-Fi, or other means. The master controller 1005 can be a personal computer that runs the Windows or Linux operating systems, and can run software that connects to and communicates with each of the test stations 60*a-f*, as further described in conjunction with FIGS. 11-14. Those skilled in the art will understand and appreciate that although six test stations 60*a-f* are shown in FIG. 10, a system in accordance with the present disclosure is not limited to six. A test system that incorporates the features discussed herein can employ virtually any number of test stations to simultaneously test any number of remote control units.

Figure 11:
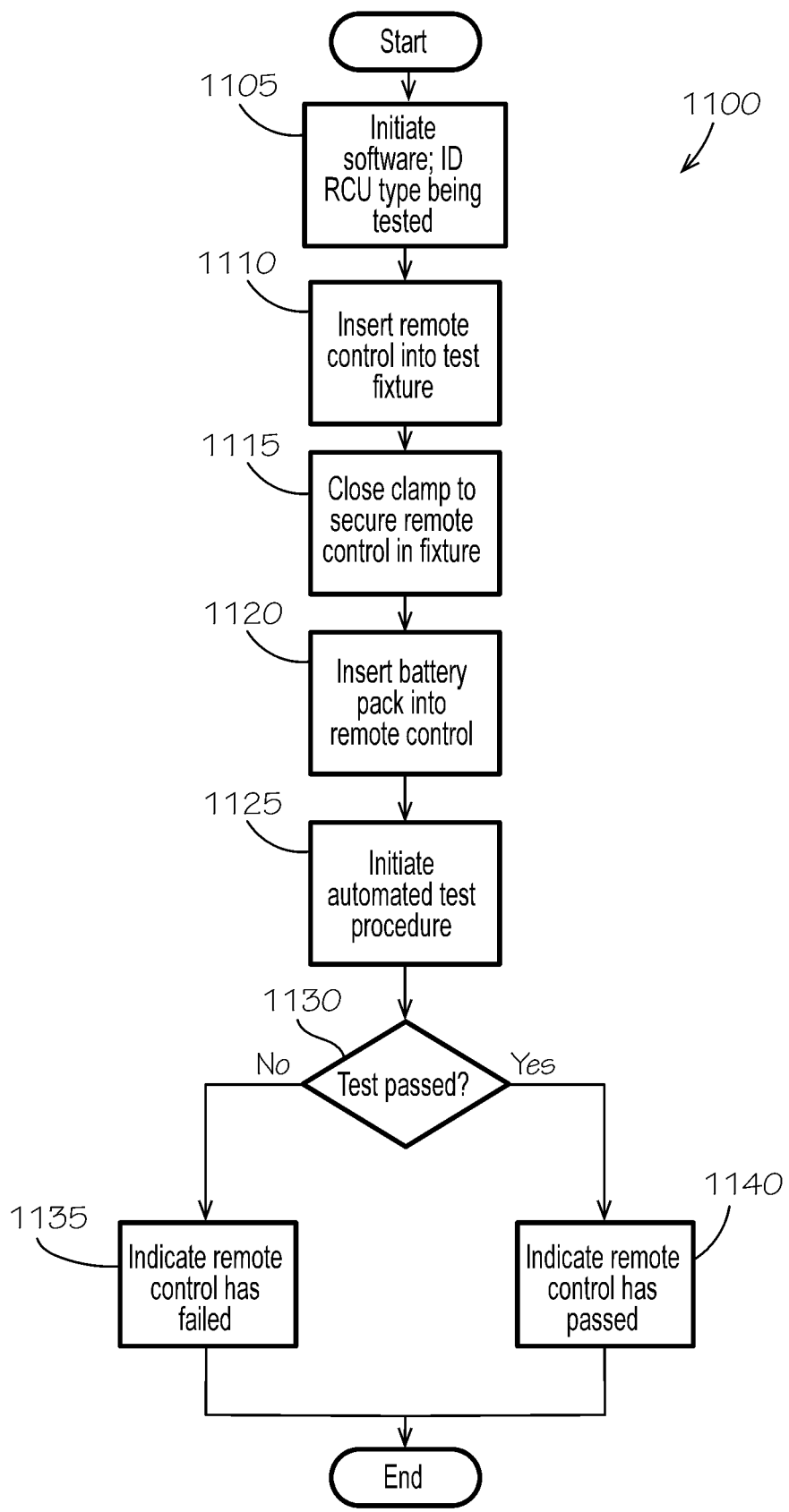
FIG. 11 is a flow chart illustrating a process for using the test system of FIG. 10 to test remote control units.

FIG. 11 is a flow chart illustrating the high level process that may be carried out by an operator using a test system 1000 as described herein. The test process 1100 begins at step 1105 when an operator uses the touch screen display 1010 to initiate the testing software and indicate the type of remote control units being tested. At that point, the master controller 1005 will download to each test station the test software that is designed to operate the test fixture and test the specific types of remote control units to be tested. The master controller will also display an appropriate user interface on the display 1010, such as those illustrated in FIGS. 12 and 14.

Figure 12:
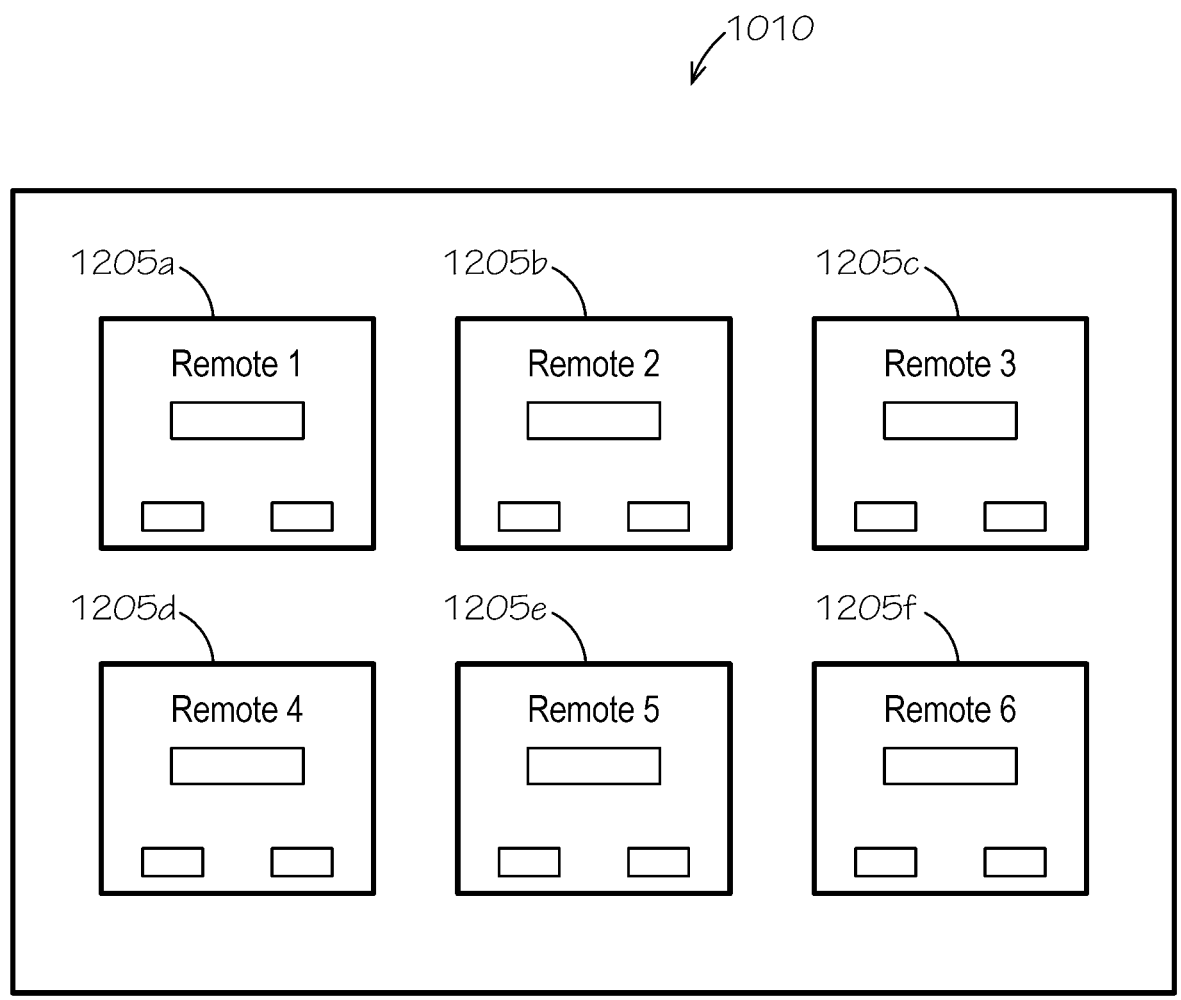
FIG. 12 is a drawing illustrating features of a display associated with the test system of FIG. 10.

In FIG. 12, the display 1010 provides a user interface suitable for monitoring and controlling each of the test stations attached to the master controller 1005. In this illustration, FIG. 10 depicts six test stations 60*a-f* and FIG. 12 depicts a user interface with six windows 1205*a-f*, each of which is associated with one of the test stations 60*a-f*.

After the test system is configured, the operator proceeds to step 1110 and inserts a remote control unit into one of the test fixtures that form a part of test stations 60*a-f*. As described earlier in conjunction with FIGS. 4 and 5, the remote control unit 10 is inserted upside down with the buttons 15 resting against the actuators 80 and set screws 75 on the actuator plate 115.

At step 1115 the operator closes the toggle clamp 85 to ensure that the remote control unit 10 is held firmly in place and that the buttons 15 are properly aligned with the actuators 80.

At step 1120 the operator inserts the line-powered battery pack simulator 120 into the battery compartment 45 of the remote control unit 10, using the handle 130 for convenience.

At step 1125 the operator initiates the automatic test of that remote control unit using the touch screen display 1010. At that point, the master controller 1005 will send a signal to the corresponding test station and instruct it to initiate the testing of the remote control unit under test.

At this point, the operator may insert another remote control unit into one of the unused test stations and repeat steps 1110, 1115, 1120, and 1125 to initiate testing of that remote control unit. Those skilled in the art will appreciate that the test system 1000 may be used to simultaneously test one or more remote control units and that the testing of one remote control is asynchronous to the others. In other words, the test system may be used to test remote control units as quickly as the operator is able to remove a remote control unit from a test station, replace it with another one, and use the master controller's user interface to initiate the testing of the next remote control unit.

For each remote control unit under test, once the testing is complete, the operator will receive an indication whether the remote control unit passed or failed the automated test at step 1130. The master controller's display 1010 may provide a pass/fail indication as described further in conjunction with FIG. 14.

If the operator determines that the remote control unit has not passed the automated test, he or she will proceed to step 1135 and indicate that the remote control unit has not passed. This indication can involve a written notation of some sort, a sticker being attached to the remote control unit, or simply placing it in a box or area reserved for failed remote control units.

If the display 1010 (or other indicator) indicates that the remote control unit has passed the automated test, he or she will proceed to step 1140 and indicate that the remote control unit has passed. This indication may involve a written notation of some sort, a sticker being attached to the remote control unit, or simply placing it in a box or area reserved for remote control units that have passed the test.

In both cases (i.e., passing or failing), the master controller 1005 may log the results of the test by saving information pertaining to the test results. This data may be stored locally in the master controller 1005, or transferred and saved in a remote server (not shown) or in a cloud-based storage system (not shown).

At this point, the testing of the remote control unit is complete and the test station is ready to test another remote control unit. Those skilled in the art will appreciate that these steps may be carried out for each test station while the other test stations are conducting tests of other remote control units or while other test stations are idle.

Figure 13:
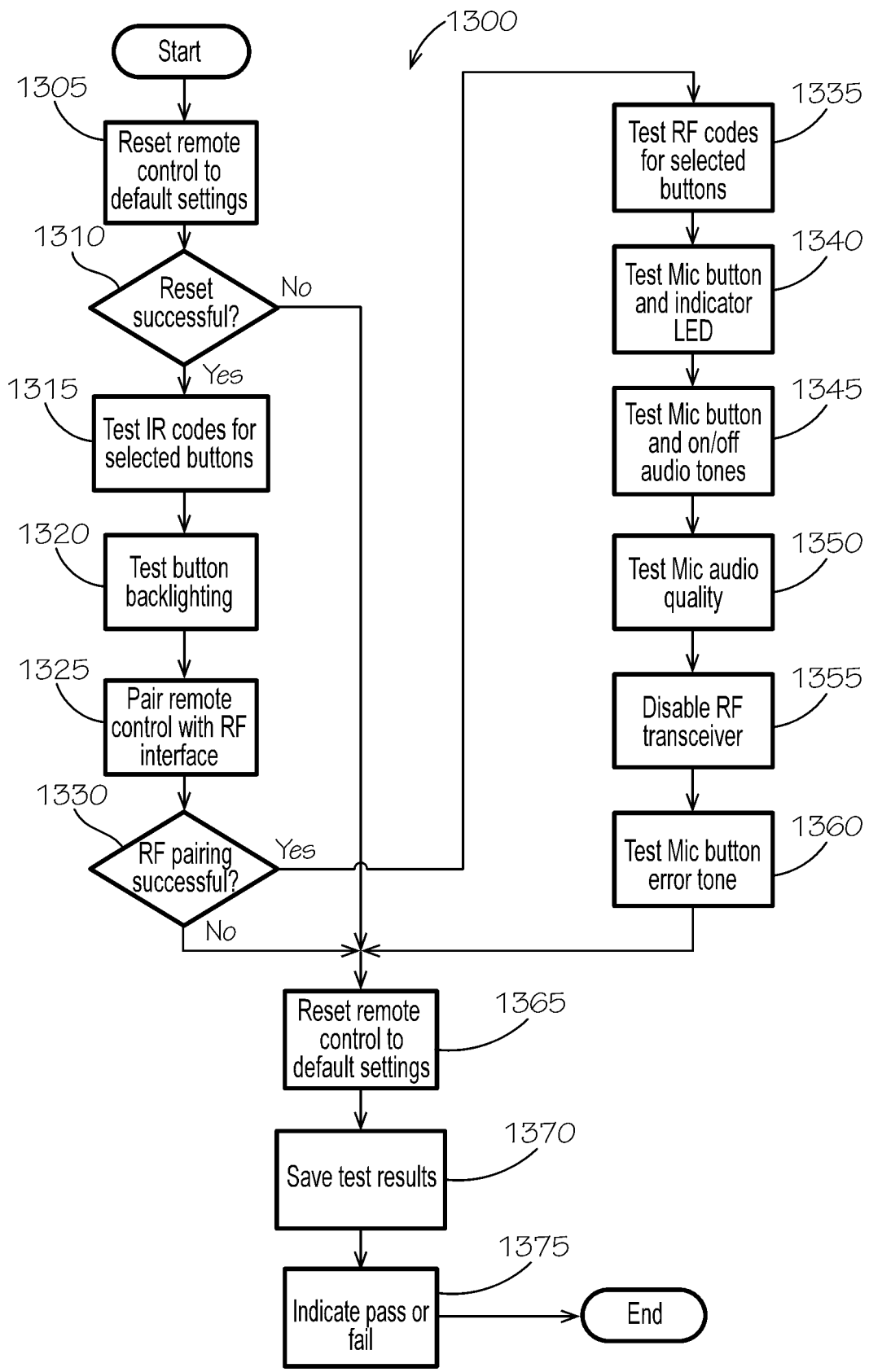
FIG. 13 is a flow chart illustrating an automated process for testing the functionality of a remote control unit.

FIG. 13 is a flow chart illustrating a set of steps that may be performed by an automated test procedure performed by a test station 60*a-f* as part of an automated test of a remote control unit 10. The test process illustrated in FIG. 13 can be the automated test procedure discussed above in FIG. 11 in conjunction with step 1125. As noted above, each test station can execute the automated test asynchronously and independently of the other test stations that are connected to the same master controller 1005.

In the automated test procedure 1300 of FIG. 13, the test begins at step 1305 after a remote control unit is clamped into the test fixture and the test is initiated by an operator (FIG. 11, step 1125). At step 1305 the controller resets the remote control unit to its default settings. This can be accomplished by pressing buttons in a prescribed sequence. For example, if the remote control unit 10 under test may be reset by pressing the "setup" button followed by "9," "6," and "3," the controller would cause the actuators associated with those keys to be actuated in that sequence for the prescribed amount of time. The controller may use digital input/output pins to address the desired actuator via the decoder on the test fixture circuit board 83 and other input/output pins to control the relay on the controller interface board so as to provide the desired voltages to the actuators.

At step 1310 the automated test procedure determines if the attempt to reset the remote control unit was successful. The controller 170 may accomplish this by using other digital output pins to address the light sensor 100 that is positioned adjacent to the status LED 20 on the remote control unit. The controller may accomplish this by using digital input/output pins to address the desired light sensor via the I2C switch on the test fixture circuit board 83 and by using I2C pins on the controller to communicate with and read data from the light sensor. The controller may compare the value returned by the light sensor with values that are known to correspond to the color of the status LED when the remote control unit has been reset to factory defaults. For example, if the status LED should turn green following reset, the controller will compare the values read from the light sensor to the values associated with green. Similarly, if the status LED is supposed to blink, the controller may take multiple readings from the light sensor and determine if the captured values correspond to a blinking light of the expected color.

If the values provided by the light sensor do not match the values associated with a successful reset, the method proceeds to step 1365, which will be discussed below.

If the values provided by the light sensor do match the values associated with a successful reset, the method proceeds to step 1315, where the controller tests the IR codes associated with some or all of the buttons on the remote control. To test the IR codes, the controller can cause the actuators 80 to press each button on the remote control unit, read the IR code value transmitted by the remote control unit, and compare it to the IR code that corresponds to the pressed button. As discussed above, pressing the desired button is accomplished when the controller's digital input/output pins are used to address the desired button via the decoder and relay on the test fixture circuit board, and the controller controls the solid state relay so as to provide the proper voltage to the relay and actuator. As (or shortly after) the button is pressed, the controller may begin polling a digital input pin associated with the IR receiver and determine the code that is being transmitted by the remote control unit. After the IR code is received, the controller may retrieve the expected value from a database of IR codes and compare the expected code to the code received from the IR receiver. For example, when the controller is testing the "channel up" button, it may query a database stored in the controller's memory and determine the code associated with the "channel up" button. The IR code received from the IR receiver would then be compared to the code that was retrieved from the database. This sequence of steps would be repeated for each button to be tested.

The automated test procedure may then proceed to step 1320 and test to see if the button backlighting feature of the remote control unit is functioning properly. To accomplish this, the controller initiates an action that would trigger the backlighting feature, such as pressing one of the buttons on the remote control unit. Once the controller causes a button to be pushed in the manner described above, the controller will query one or more of the light sensors and determine if the values returned by the light sensors are consistent with light generated by the backlight feature. As described above in conjunction with reading values from the status LED light sensor, the controller can use address lines and the I2C switch to query one or more of the light sensors. In an aspect of the disclosure, the light sensors may be not queried simultaneously, so reading the values from more than one light sensor requires that multiple light sensors be addressed and read in sequence. The values returned by the light sensors may allow the controller to determine if the backlighting feature is functioning.

After the backlight test, the automated test procedure proceeds to step 1325 and prepares to perform a variety of tests associated with the remote control unit's RF4CE functionality. At step 1325 the controller performs steps required to pair the remote control unit with the RF receiver. In order to interact with the RF4CE dongle (RF receiver 180) and place it in pairing mode, the controller can use a Linux-based client server application that implements the RF4CE MSO profile published by CableLabs. This is a profile for RF4CE that is specifically designed to facilitate remote control of a target by a controller in a cable set-top environment. The RF4CE MSO profile is based on the Zigbee Remote Control profile with additions and changes to make it suitable for a cable user environment. These changes include button-less pairing, which allows users to pair a remote without having to press a physical button on the target device.

The RF4CE interface can be implemented using the RemoTI RF4CE-compliant software architecture from Texas Instruments. The RemoTI architecture offers a software architectural framework and all of the tools, documentation, and support needed to build an RF4CE-compliant product. Those skilled in the art will appreciate that the RemoTI architecture includes many useful features, including voice-over-RF4CE support.

Thus the pairing process requires the controller to communicate with the RF4CE dongle and put it in the pairing mode, while also using the actuators to press the buttons on the remote control unit 10 that will place the remote control unit in the pairing mode. For example, a remote control unit 10 may be placed in the pairing mode by pressing and holding the setup button for several seconds or until a status LED changes colors.

Once step 1325 is completed, the automated test procedure determines if the RF pairing was successful at step 1330. This step may be similar to step 1310 above in the sense that the controller acquire data from the light sensor associated with the status LED and determine if the color of the light corresponds to an expected value. This may be done by comparing the read value to a value stored in memory. Alternatively, the controller may receive data from the RF4CE dongle that indicates that the pairing was successful, along with information about the paired remote control unit (e.g., the remote control unit's unique MAC (Media Access Control) address). The MAC address allows an RF4CE receiver to differentiate between multiple RF4CE remote control units when more than one remote control unit is using the same channel. In addition, the MAC address may be used as a pseudo-serial number as a way to identify remote control units.

If the values provided by the light sensor or RF4CE dongle do not match the values associated with a successful RF pairing, the method proceeds to step 1365, which is discussed below.

If the values provided by the light sensor or RF4CE dongle do match the values associated with a successful RF pairing, the method proceeds to step 1335, where the controller tests the RF codes associated with some or all of the buttons on the remote control. The process of testing the RF codes requires the controller to cause the actuators to press each button on the remote control unit, read the RF code value transmitted by the remote control unit, and compare it to the RF code that corresponds to the pressed button. As discussed above, pressing the desired button is accomplished when the controller's digital input/output pins are used to address the desired button via the decoder and relay on the test fixture circuit board, and the controller controls the solid state relay so as to provide the proper voltage to the relay and actuator.

As (or shortly after) the button is pressed, the controller may begin polling the RF receiver 180 (the RF4CE dongle) and determine the code that is being transmitted by the remote control unit and received by the RF4CE dongle. After the RF code is received, the controller may retrieve the expected value from a database of RF codes and compare the expected code to the code that was received from the RF receiver. For example, when the controller is testing the "channel up" button, it may query a database stored in the controller's memory and determine the code associated with the "channel up" button. The RF code received from the RF receiver would then be compared to the code that was retrieved from the database. This sequence of steps would take place for each button to be tested.

As referenced above, in order to test the remote control code transmitted by the remote control unit 10 in response to the pressing of a button, the controller can store in its memory a database or file of the appropriate RF and IR remote control codes. An RF4CE code library is included in Annex A of the Cable Profile for the ZigBee RF4CE Remote Control Specification published by CableLabs and cited above. Other code libraries may be obtained from other sources. The IR code library can be selected to match the specific model of remote control unit being tested. IR code libraries are available from a variety sources, including commercial vendors such as Universal Equipment, Inc., and from free sources such as http://lirc-remotes.sourceforge.net/remotes-table.html. Those skilled in the art will appreciate that the IR and RF remote control codes associated with a particular function or key need not be the same.

An important aspect of the automated test procedure is the ability to test the remote control unit's voice-related functionality. The remote control unit's ability to recognize and process voice commands (e.g., "watch ESPN") is an attractive feature for subscribers, and it is important that the functionality be tested and operating properly before a remote control unit is provided to a subscriber. In an exemplary embodiment, the voice-related functionality is associated with and implemented via the RF4CE interface. As a result, testing of the voice-related functions can take place after the remote control unit is paired with the RF4CE dongle at step 1325.

After the RF codes are tested at step 1335, the automated test procedure can proceed to step 1340 in order to determine if the remote control unit's microphone is functioning properly. This is accomplished by pressing the microphone button 25 on the remote control unit and checking to see if the status LED 20 changes color. As described above, the controller 170 may accomplish this by sending signals to the decoder to address the actuator 80 that corresponds to the microphone button 25, along with the voltage required to cause the solenoid to press and hold the button. As the microphone button 25 is being held, the controller can send signals to the I2C switch and query the light sensor that is associated with the status LED. The light sensor will return data that corresponds to the color and intensity of the light emitted by the status LED. In the case of the VEML6040 RGBW Color Sensor from Vishay Semiconductors, the light sensor returns a 16-bit value for each channel (i.e., for red, green, blue and white). As a result, the controller can read all four 16-bit values and compare that data with stored values that are associated with the status LED color that is expected if the microphone is working properly. For example, if the status LED is supposed to turn blue when the microphone button 25 is pressed, the controller will read the values from the light sensor and determine if they indicate that the status LED is, in fact, blue. The controller can cause the actuator to release the microphone button 25 once the values are read from the light sensor.

The automated test procedure then proceeds to step 1345 in order to determine if the remote control unit emits an audible indication (i.e., a "mic on" tone) when the microphone button 25 is pressed and a "mic off" tone when it is released. This is accomplished by pressing the microphone button 25 on the remote control unit 10 and checking to see if the speaker 40 emits a "mic on" tone. As described above, the controller 170 may accomplish this by sending signals to the decoder to address the actuator 80 that corresponds to the microphone button 25, along with the voltage required to press and hold the button. As the microphone button 25 is being held, the controller can sample an analog input associated with the fixture microphone 90 and store the values received from microphone input. The controller can then compare these values to stored values that reflect tone that should be emitted by the remote control unit's speaker if it is functioning properly. If the sampled values from the fixture microphone 90 match (within an accepted range) the expected values, the controller may indicate that the feature did function properly.

Similarly, the automated test procedure can test for an audible that indicates that the microphone button 25 has been released (i.e., a "mic off" tone). The controller 170 may accomplish this by de-energizing the actuator 80 that corresponds to the microphone button 25. When the microphone button 25 is released, the controller can sample an analog input associated with the fixture microphone 90 and store the values received from microphone input. The controller can then compare these values to stored values that reflect tone that should be emitted by the remote control unit's speaker if it is functioning properly. If the sampled values from the fixture microphone 90 match (within an accepted range) the expected values, the controller may indicate that the feature did function properly.

The automated test procedure proceeds to step 1350, where it tests the remote control unit's audio quality. To accomplish this, the controller 170 causes an actuator 80 to press and hold the microphone button 25 as described above. While the microphone button 25 is pressed, the controller will play out an audio tone or an audio file (such as a .wav, .mp3, or other file) on the analog output pins that are connected to the audio amplifier and fixture speaker 110. If the remote control unit and the RF4CE interface are working properly, the remote control unit's microphone 30 will pick up the audio file that is played over the fixture speaker and transmit it to the RF4CE dongle. At that point, the controller may receive the audio data from the RF4CE dongle and store it in its memory. The received audio file may be compared to the audio file that was played out to the fixture speaker and determine the correlation between the two files. If the correlation is sufficient, or meets or exceeds a predetermined threshold, it may indicate that the remote control unit's microphone and the associated functionality are performing satisfactorily. Alternatively, the received audio file may be analyzed to determine if the characteristics (e.g., frequency, amplitude, etc.) of the audio captured by the remote control unit's microphone satisfy an established pass/fail threshold.

Another aspect of the microphone-related testing relates to how the remote control unit responds if the microphone button 25 is pressed but the RF4CE link is not operational. As described above, in the present embodiment, the voice-related functionality requires that the remote control unit be paired with an RF4CE target, such as a set-top box. In the testing scenarios described above, the remote control unit is paired with an RF4CE dongle that is plugged into the controller's USB slot. The testing in the previous steps required that that RF4CE link be active. The tests in steps 1355 and 1360 require that the link be inactive in order to determine if the remote control unit generates a "mic error" tone under these circumstances.

At step 1355, the controller disables the RF transceiver. The controller may accomplish this by sending an appropriate command to the RF4CE dongle via the USB port.

At step 1360, the controller performs steps that are similar to those performed in step 1345. The controller 170 may send signals to the decoder to address the actuator 80 that corresponds to the microphone button 25, along with the voltage required to press and hold the button. As the microphone button 25 is being held, the controller can sample an analog input associated with the fixture microphone 90 and store the values received from microphone input. The controller can then compare these values to stored values that reflect tone that should be emitted by the remote control unit's speaker when it encounters an error in the RF4CE communication. If the sampled values from the fixture microphone 90 match (within an accepted range) the expected values, the controller may indicate that the feature functioned properly and emitted the "mic error" tone.

Step 1365 begins the final steps associated with the automated test procedure 1300. The test procedure may arrive at step 1365 after steps 1310, 1330, or 1360, as shown in FIG. 13. At step 1365, the controller attempts to reset the remote control unit to its factory default settings so that it will be ready for use by a new subscriber. This is accomplished in the same manner as described above in conjunction with step 1305.

At step 1370, the master controller 1005 saves the test results in memory associated with the controller. This may be accomplished in various ways. For example, the controller may keep a simple tally of passed and failed remote control units. In this case, the controller would need to increment a counter associated with passing or failing, whichever is the case. Alternatively, the results of the test may be stored with the remote control unit's unique MAC address. Those skilled in the art will appreciate that most remote control units do not have serial number or other means for uniquely identifying one remote control unit from another. However, in the case of RF4CE-compatible remote control units, each remote control unit has a unique MAC address that can be used to distinguish one device from another on the RF4CE communications channels. This MAC address may be used in place of a serial number to track the results of the testing. In this case, the MAC address and results would be stored in memory associated with the controller.

Those skilled in the art will appreciate that storing such information may be useful because it allows those doing the testing to track the status of remote control units that it has tested. If one of the tested remote control units is returned to the testing company due to a problem, they will have some data about the earlier testing and performance of the remote control unit. This data may be kept in a database or other file kept on the master controller 1005. Alternatively, the database or file may be transmitted to a separate device or location, such as a remote computer or cloud storage. The stored information for each remote control unit can include whether it passed or failed the test and, if it failed, which specific test or tests it failed.

At step 1375, the automated testing procedure indicates to the operator whether the remote control unit under test has passed or failed. This may be accomplished by means of the display 1010 that is connected to the master controller 1005. Once the operator is provided with the results, he or she may remove the remote control device from the test fixture and place it in a place designated for remote control units that pass or fail the testing, as the case may be.

At this point, the testing of a remote control unit is complete and the remote control unit may be removed from the test fixture so that the test fixture is available to test additional remote control units.

Figure 14:
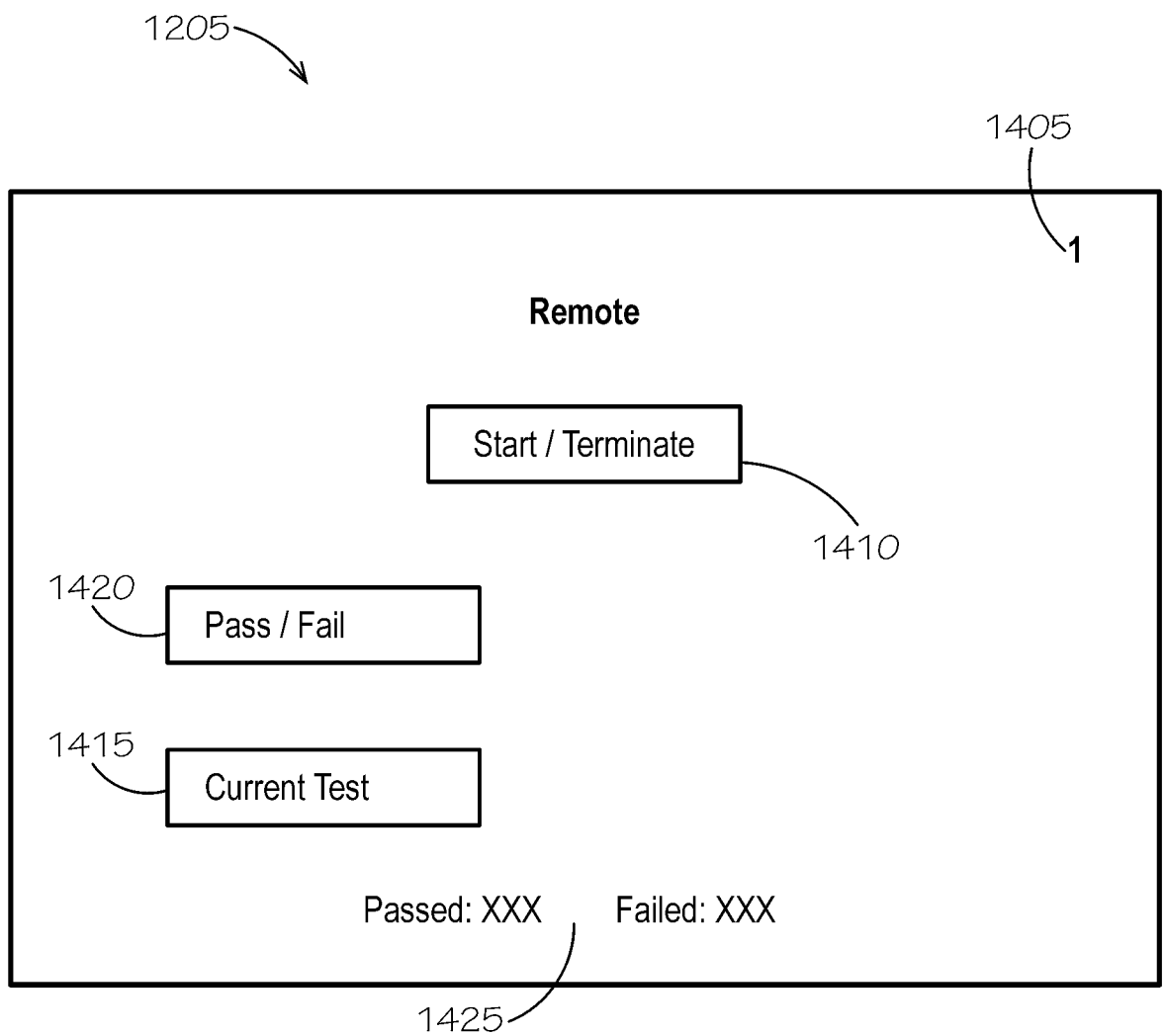
FIG. 14 is a drawing illustrating features of a single window of the display of FIG. 12.

FIG. 14 illustrates additional information that can be provided in the windows 1205a-f that are displayed on display 1010 by the master controller 1005. As described above, the purpose of a window 1205 is to provide a user interface that facilitates the operator's ability to control and monitor the progress of the automated testing described above. As described here, the display 1010 will be described as a touch screen display capable of receiving touch input from the operator. Alternatively, a keyboard 1015 or mouse 1020 may be required to move a cursor over the interactive areas in window 1205 and to provide appropriate input to the master controller 1005.

By way of illustration, each window 1205 may provide a test station number 1405 in order to indicate which test station is associated with that window.

The window 1205 can also provide a start/terminate field 1410. The operator may touch this field to initiate the automated test on a test station after a remote control unit is placed in it as described in FIG. 11. Once the test is running, this field will provide a mechanism by which the operator may terminate the test if there is a need or desire to do so.

The window 1205 can include a current test field 1415 that indicates the specific test that is being performed by that test station at any given point in the process. For sample, if the associated test station is testing the IR codes (see step 1315 in FIG. 13), the current test field can display "Testing IR codes" or some other appropriate message. Similar status messages can be displayed for other tests or conditions. This can allow the operator to monitor the testing and determine if the automated test is progressing as expected. In order to display status messages, the master controller 1005 receives information from the test stations 60a-f throughout the testing cycle.

Once the testing is complete, the pass/fail field 1420 can display a message that indicates whether the remote control unit under test passed or failed the test (see step 1375 in FIG. 13). A simple "passed" message can be used to indicate that the remote control unit under test has passed all of the tests. A more detailed "failed" message can indicate which test or tests the remote control unit failed. For example, a message that says "Failed IR codes" would indicate that the remote control unit failed the IR code portion of the test.

A current count field 1425 can be used to indicate how many tests have been performed by a test station and how many of the remote control units tested by the test station passed or failed the automated test.

Those skilled in the art will appreciate that the automated testing process 1300 of FIG. 13 is provided by way of example only and that many variations are possible. For example, an automated testing process may perform all or fewer of the tests shown here. Alternatively, additional or alternative tests may performed as part of the testing process depending on the features associated with the remote controls under test. Similarly, the conditions under which the tests terminate also may vary. For example, automated test procedure 1300 arrives at step 1365 from one of three steps, namely steps 1310, 1330, or 1360. In order to save time, the operator of the test station may want the procedure to terminate as soon as the remote control unit under test fails any test. It is also possible that the operator of the test station may want to run all of the tests even if one or more are failed in order to produce a comprehensive list of the features that do or do not work. This information may assist the operator in any decisions to be made about whether a failing remote control unit may be repaired. For example, a determination that everything except the button backlighting passed the test may lead a test station operator to conclude that the remote control unit should be repaired. Other test outcomes and possible conclusions to be drawn from those outcomes will be known to those skilled in the art. As mentioned above, all of this information can be stored in order to provide information about specific remote control units, or about trends that may develop after testing many remote control units. Those skilled in the art will appreciate that there can be many uses for this type of data.

Those skilled in the art will appreciate that the specific tests and sequences discussed in conjunction with the automated test procedure 1300 are provided as an illustration and that many variations as possible depending on the features of the remote control units being tested and the test station being employed.

Those skilled in the art will appreciate how the present disclosure and the embodiments described herein provide a test station 60 and test fixture 62 that are capable of testing multiple functions on a remote control unit 10. The components of the test fixture 62 can be controlled by a controller 170 that runs a test script or routine that causes the components of the test fixture 62 to provide the desired inputs to the remote control unit, and to collect and analyze the outputs from the remote control unit 10. In the embodiments disclosed herein, the inputs to the remote control unit under test include the button presses from the actuators 80 and audio output from the fixture speaker 110. The outputs from the remote control unit under test include IR and RF remote control codes, the status LED 20, the button backlights, and speaker output. An exemplary test fixture for use in a test station, along with a test system in which test stations may be used, are disclosed in the co-pending applications cited above in the Cross-Reference to Related Applications, which are incorporated herein by reference in their entireties. In light of the foregoing discussion, those skilled in the art will appreciate that a test station that has been used to test one model of remote control unit may be reconfigured to test a different model by replacing the text fixture with a new, appropriate test fixture, and causing the controller in the control box to execute a test routine compatible with the new text fixture and the new model of remote control unit.

Although several aspects have been disclosed in the foregoing specification, it is understood by those skilled in the art that many modifications and other aspects will come to mind to which this disclosure pertains, having the benefit of the teaching presented in the foregoing description and associated drawings. It is thus understood that the disclosure is not limited to the specific aspects disclosed hereinabove, and that many modifications and other aspects are intended to be included within the scope of any claims that can recite the disclosed subject matter.

The logical operations, functions, or steps described herein as part of a method, process or routine may be implemented (1) as a sequence of processor-implemented acts, software modules, or portions of code running on a controller or computing system and/or (2) as interconnected machine logic circuits or circuit modules within the controller or computing system. The implementation is a matter of choice dependent on the performance and other requirements of the system. Alternate implementations are included in which operations, functions or steps may not be included or executed at all, may be executed out of order from that shown or discussed, including substantially concurrently or in reverse order, depending on the functionality involved, as would be understood by those reasonably skilled in the art of the present disclosure.

One should note that conditional language, such as, among others, "can," "could," "might," or "may," unless specifically stated otherwise, or otherwise understood within the context as used, is generally intended to convey that certain aspects include, while other aspects do not include, certain features, elements and/or steps. Thus, such conditional language is not generally intended to imply that features, elements and/or steps are in any way required for one or more particular aspects or that one or more particular aspects necessarily comprise logic for deciding, with or without user input or prompting, whether these features, elements and/or steps are included or are to be performed in any particular aspect.

It should be emphasized that the above-described aspects are merely possible examples of implementations, merely set forth for a clear understanding of the principles of the present disclosure. Any process descriptions or blocks in flow diagrams should be understood as representing modules, segments, or portions of code which comprise one or more executable instructions for implementing specific logical functions or steps in the process, and alternate implementations are included in which functions may not be included or executed at all, can be executed out of order from that shown or discussed, including substantially concurrently or in reverse order, depending on the functionality involved, as would be understood by those reasonably skilled in the art of the present disclosure. Many variations and modifications can be made to the above-described aspect(s) without departing substantially from the spirit and principles of the present disclosure. Further, the scope of the present disclosure is intended to cover any and all combinations and sub-combinations of all elements, features, and aspects discussed above. All such modifications and variations are intended to be included herein within the scope of the present disclosure, and all possible claims to individual aspects or combinations of elements or steps are intended to be supported by the present disclosure.

What is claimed is:

1. A system for simultaneously testing a plurality of remote control units, comprising:
   a plurality of test stations, each of the test stations operative to hold a remote control unit of a plurality of remote control units and to execute a test routine to test the remote control unit;
   a plurality of actuators associated with each test station of the plurality of test stations and arranged to press a plurality of buttons on the remote control unit held in the test station, each actuator of the plurality of actuators corresponding to a different button of the plurality of buttons on the remote control unit;
   a master controller connected to the plurality of test stations and operative to control the tests executed by each test station of the plurality of test stations, the tests being executed by at least two of the test stations being independent of each other; and
   a user interface device connected to the master controller and operative to display a window associated with each of the plurality of test stations and to receive instructions and display information associated with the testing of the plurality of remote control units by the plurality of test stations.

2. The system for simultaneously testing a plurality of remote control units of claim 1, wherein the master controller is further operative to receive from each test station test results associated with a remote control unit of the plurality of remote control units and to store the test results along with a unique identifier associated with each of the remote control units.

3. The system for simultaneously testing a plurality of remote control units of claim 1, wherein each test station of the plurality of test stations comprises:
   a radio frequency receiver operative to receive a radio frequency signal transmitted by the remote control unit in response to the pressing of a button on the remote control unit.

4. The system for simultaneously testing a plurality of remote control units of claim 3, wherein the radio frequency receiver and the radio frequency signal are compatible with the Radio Frequency for Consumer Electronics (RF4CE) standard.

5. The system for simultaneously testing a plurality of remote control units of claim 1, wherein each test station of the plurality of test stations comprises:
   an infrared receiver operative to receive an infrared signal transmitted by the remote control unit in response to the pressing of a button on the remote control unit.

6. The system for simultaneously testing a plurality of remote control units of claim 1, wherein the user interface device comprises a touch screen display.

7. The system for simultaneously testing a plurality of remote control units of claim 1, wherein the user interface device comprises a display, a keyboard, and a pointing device.

8. The system for simultaneously testing a plurality of remote control units of claim 1, wherein the master controller provides a test routine to a test station in response to first input received via the user interface device and the master controller is operative to cause the test station to initiate the test routine in response to second input received via the user interface device.

9. A system for simultaneously testing a plurality of remote control units, comprising:
   a plurality of test stations, each of the test stations operative to hold a remote control unit of a plurality of remote control units and to execute a test routine to test the remote control unit, each of the test stations comprising a plurality of actuators arranged to press a different button of a plurality of buttons on the remote control unit;
   a master controller connected to the plurality of test stations and operative to control the tests executed independently and asynchronously by each test station of the plurality of test stations; and
   a user interface device connected to the master controller and operative to display a window associated with each of the plurality of test stations and to receive instructions and display information associated with the testing of the plurality of remote control units by the plurality of test stations,
   wherein the master controller is further operative to receive from each test station test results associated with a remote control unit of the plurality of remote control units and to store the test results along with unique identifiers associated with each of the remote control units.

10. The system for simultaneously testing a plurality of remote control units of claim 9, wherein each test station of the plurality of test stations comprises
    a radio frequency receiver operative to receive a radio frequency signal transmitted by the remote control unit in response to the pressing of a button on the remote control unit, and
    an infrared receiver operative to receive an infrared signal transmitted by the remote control unit in response to the pressing of a button on the remote control unit.

11. The system for simultaneously testing a plurality of remote control units of claim 10, wherein the radio frequency receiver and the radio frequency signal are compatible with the Radio Frequency for Consumer Electronics (RF4CE) standard.

12. The system for simultaneously testing a plurality of remote control units of claim 10, wherein each test station further comprises a speaker operative to provide an audio input to a microphone on the remote control unit, and
    each test station is operative to cause a first actuator of the plurality of actuators to press a first button of the plurality of buttons on the remote control,
    output audio corresponding to a first audio file to the speaker on the test fixture,
    receive a radio frequency signal from the remote control unit, the radio frequency signal corresponding to a second audio file, and
    analyze the second audio file to determine if the microphone is working properly.

13. The system for simultaneously testing a plurality of remote control units of claim 12, wherein analyzing the second audio file comprises determining a correlation between the first audio file and the second audio file, and the test station is further operative to indicate that the remote control unit is operating properly if the correlation between the first audio file and the second audio file exceeds a predetermined threshold.

* * * * *